US009082676B2

(12) United States Patent
Kurokawa

(10) Patent No.: US 9,082,676 B2
(45) Date of Patent: *Jul. 14, 2015

(54) METHOD FOR DRIVING SEMICONDUCTOR DEVICE

(71) Applicant: Semiconductor Energy Laboratory Co., Ltd., Atsugi-shi, Kanagawa-ken (JP)

(72) Inventor: Yoshiyuki Kurokawa, Sagamihara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 35 days.

This patent is subject to a terminal disclaimer.

(21) Appl. No.: 13/780,385

(22) Filed: Feb. 28, 2013

(65) Prior Publication Data

US 2013/0234027 A1 Sep. 12, 2013

(30) Foreign Application Priority Data

Mar. 9, 2012 (JP) ................................ 2012-053041
Mar. 12, 2012 (JP) ................................ 2012-054947
Mar. 13, 2012 (JP) ................................ 2012-056150

(51) Int. Cl.
*H01L 27/146* (2006.01)
*H04N 5/232* (2006.01)
(Continued)

(52) U.S. Cl.
CPC ......... *H01L 27/14643* (2013.01); *G01S 7/4865* (2013.01); *G01S 17/89* (2013.01);
(Continued)

(58) Field of Classification Search
CPC .................... H01L 29/7869; H01L 27/14643; H01L 27/14601; H01L 31/09
USPC ...................................................... 250/338.4
See application file for complete search history.

(56) References Cited

U.S. PATENT DOCUMENTS 4,438,455 A 3/1984 Tabei
5,422,483 A * 6/1995 Ando et al. ............. 250/339.02
(Continued)

FOREIGN PATENT DOCUMENTS

CN 101635860 1/2010
CN 102792677 11/2012
(Continued)

OTHER PUBLICATIONS

Brown.C et al., "31.3: A System LCD with Integrated 3-Dimensional Input Device,", SID Digest '10 : SID International Symposium Digest of Technical Papers, 2010, pp. 453-456.
(Continued)

*Primary Examiner* — Marcus Taningco
(74) *Attorney, Agent, or Firm* — Eric J. Robinson; Robinson Intellectual Property Law Office, P.C.

(57) ABSTRACT

A semiconductor device capable of acquiring high-precision range information in a short time is provided. Alternatively, a semiconductor device capable of acquiring the range information and image information concurrently in a short time is provided. The accuracy of range information is increased by performing infrared light irradiation more than once to acquire a detection signal and making infrared light irradiation periods identical and extremely short. By detecting light reflected from substantially the same points of an object by adjacent photodiodes, the accuracy of range information can be maintained even when the object is a moving object. By overlapping a photodiode absorbing visible light and transmitting infrared light with a photodiode absorbing infrared light, range information and image information can be acquired concurrently.

20 Claims, 15 Drawing Sheets

500
505
503
504
501
100
502

(51) Int. Cl.
*G01S 17/89* (2006.01)
*G01S 7/486* (2006.01)

(52) U.S. Cl.
CPC ...... *H04N5/23212* (2013.01); *H01L 27/14603* (2013.01); *H01L 27/14609* (2013.01); *H01L 27/14649* (2013.01); *H01L 27/14692* (2013.01)

(56) References Cited

U.S. PATENT DOCUMENTS 5,731,856 A 3/1998 Kim et al.
5,744,864 A 4/1998 Cillessen et al.
5,965,875 A 10/1999 Merrill
6,294,274 B1 9/2001 Kawazoe et al.
6,563,174 B2 5/2003 Kawasaki et al.
6,727,522 B1 4/2004 Kawasaki et al.
6,747,638 B2 6/2004 Yamazaki et al.
7,049,190 B2 5/2006 Takeda et al.
7,061,014 B2 6/2006 Hosono et al.
7,064,346 B2 6/2006 Kawasaki et al.
7,105,868 B2 9/2006 Nause et al.
7,211,825 B2 5/2007 Shih et al.
7,271,835 B2 9/2007 Iizuka et al.
7,282,782 B2 10/2007 Hoffman et al.
7,297,977 B2 11/2007 Hoffman et al.
7,323,356 B2 1/2008 Hosono et al.
7,385,224 B2 6/2008 Ishii et al.
7,402,506 B2 7/2008 Levy et al.
7,411,209 B2 8/2008 Endo et al.
7,411,620 B2 8/2008 Taniguchi et al.
7,453,065 B2 11/2008 Saito et al.
7,453,087 B2 11/2008 Iwasaki
7,462,862 B2 12/2008 Hoffman et al.
7,468,304 B2 12/2008 Kaji et al.
7,501,293 B2 3/2009 Ito et al.
7,525,523 B2 4/2009 Yamazaki et al.
7,663,165 B2 2/2010 Mouli
7,674,650 B2 3/2010 Akimoto et al.
7,732,819 B2 6/2010 Akimoto et al.
7,970,204 B2 6/2011 Sawachi
8,344,306 B2 1/2013 Kim
2001/0046027 A1 11/2001 Tai et al.
2002/0056838 A1 5/2002 Ogawa
2002/0132454 A1 9/2002 Ohtsu et al.
2003/0189401 A1 10/2003 Kido et al.
2003/0209651 A1 11/2003 Iwasaki
2003/0218222 A1 11/2003 Wager et al.
2004/0038446 A1 2/2004 Takeda et al.
2004/0127038 A1 7/2004 Carcia et al.
2005/0017302 A1 1/2005 Hoffman
2005/0199959 A1 9/2005 Chiang et al.
2006/0035452 A1 2/2006 Carcia et al.
2006/0043377 A1 3/2006 Hoffman et al.
2006/0091793 A1 5/2006 Baude et al.
2006/0108529 A1 5/2006 Saito et al.
2006/0108636 A1 5/2006 Sano et al.
2006/0110867 A1 5/2006 Yabuta et al.
2006/0113536 A1 6/2006 Kumomi et al.
2006/0113539 A1 6/2006 Sano et al.
2006/0113549 A1 6/2006 Den et al.
2006/0113565 A1 6/2006 Abe et al.
2006/0157760 A1 7/2006 Hayashi et al.
2006/0169973 A1 8/2006 Isa et al.
2006/0170111 A1 8/2006 Isa et al.
2006/0197092 A1 9/2006 Hoffman et al.
2006/0208977 A1 9/2006 Kimura
2006/0228974 A1 10/2006 Thelss et al.
2006/0231882 A1 10/2006 Kim et al.
2006/0238135 A1 10/2006 Kimura
2006/0244107 A1 11/2006 Sugihara et al.
2006/0284171 A1 12/2006 Levy et al.
2006/0284172 A1 12/2006 Ishii
2006/0292777 A1 12/2006 Dunbar
2007/0018075 A1 1/2007 Cazaux et al.
2007/0024187 A1 2/2007 Shin et al.
2007/0046191 A1 3/2007 Saito
2007/0052025 A1 3/2007 Yabuta
2007/0054507 A1 3/2007 Kaji et al.
2007/0090365 A1 4/2007 Hayashi et al.
2007/0108446 A1 5/2007 Akimoto
2007/0152217 A1 7/2007 Lai et al.
2007/0172591 A1 7/2007 Seo et al.
2007/0187678 A1 8/2007 Hirao et al.
2007/0187760 A1 8/2007 Furuta et al.
2007/0194379 A1 8/2007 Hosono et al.
2007/0252928 A1 11/2007 Ito et al.
2007/0272922 A1 11/2007 Kim et al.
2007/0287296 A1 12/2007 Chang
2008/0006877 A1 1/2008 Mardilovich et al.
2008/0038882 A1 2/2008 Takechi et al.
2008/0038929 A1 2/2008 Chang
2008/0050595 A1 2/2008 Nakagawara et al.
2008/0054319 A1 3/2008 Mouli
2008/0073653 A1 3/2008 Iwasaki
2008/0083950 A1 4/2008 Pan et al.
2008/0106191 A1 5/2008 Kawase
2008/0128689 A1 6/2008 Lee et al.
2008/0129195 A1 6/2008 Ishizaki et al.
2008/0166834 A1 7/2008 Kim et al.
2008/0182358 A1 7/2008 Cowdery-Corvan et al.
2008/0224133 A1 9/2008 Park et al.
2008/0254569 A1 10/2008 Hoffman et al.
2008/0258139 A1 10/2008 Ito et al.
2008/0258140 A1 10/2008 Lee et al.
2008/0258141 A1 10/2008 Park et al.
2008/0258143 A1 10/2008 Kim et al.
2008/0296568 A1 12/2008 Ryu et al.
2009/0068773 A1 3/2009 Lai et al.
2009/0073325 A1 3/2009 Kuwabara et al.
2009/0101948 A1 4/2009 Park et al.
2009/0114910 A1 5/2009 Chang
2009/0134399 A1 5/2009 Sakakura et al.
2009/0152506 A1 6/2009 Umeda et al.
2009/0152541 A1 6/2009 Maekawa et al.
2009/0278122 A1 11/2009 Hosono et al.
2009/0280600 A1 11/2009 Hosono et al.
2009/0295769 A1 12/2009 Yamazaki et al.
2010/0065844 A1 3/2010 Tokunaga
2010/0092800 A1 4/2010 Itagaki et al.
2010/0109002 A1 5/2010 Itagaki et al.
2010/0117991 A1 5/2010 Koyama et al.
2010/0182282 A1 7/2010 Kurokawa et al.
2011/0109591 A1 5/2011 Kurokawa et al.
2011/0109592 A1 5/2011 Kurokawa et al.
2011/0215323 A1 9/2011 Kurokawa et al.
2012/0002090 A1 1/2012 Aoki et al.
2012/0032193 A1 2/2012 Kurokawa et al.
2012/0056861 A1 3/2012 Kurokawa et al.
2012/0085890 A1 4/2012 Kurokawa
2013/0044917 A1* 2/2013 Kurokawa .................... 382/106
2013/0162778 A1 6/2013 Kurokawa

FOREIGN PATENT DOCUMENTS

EP 1737044 A 12/2006
EP 2148514 A 1/2010
EP 2226847 A 9/2010
JP 60-198861 A 10/1985
JP 63-210022 A 8/1988
JP 63-210023 A 8/1988
JP 63-210024 A 8/1988
JP 63-215519 A 9/1988
JP 63-239117 A 10/1988
JP 63-265818 A 11/1988
JP 05-251705 A 9/1993
JP 08-264794 A 10/1996
JP 11-505377 5/1999
JP 2000-044236 A 2/2000
JP 2000-150900 A 5/2000
JP 2002-076356 A 3/2002
JP 2002-289859 A 10/2002
JP 2003-086000 A 3/2003
JP 2003-086808 A 3/2003
JP 2004-103957 A 4/2004

(56) References Cited

FOREIGN PATENT DOCUMENTS

| | | | |
|---|---|---|---|
| JP | 2004-273614 | A | 9/2004 |
| JP | 2004-273732 | A | 9/2004 |
| JP | 2008-059148 | | 3/2008 |
| JP | 2010-035168 | | 2/2010 |
| JP | 2011-128024 | A | 6/2011 |
| JP | 2011-211699 | A | 10/2011 |
| JP | 2012-034354 | A | 2/2012 |
| JP | 2012-099797 | A | 5/2012 |
| JP | 2012-209961 | A | 10/2012 |
| KR | 2010-0011676 | A | 2/2010 |
| KR | 2012-0002928 | A | 1/2012 |
| TW | 201214684 | | 4/2012 |
| TW | 201216699 | | 4/2012 |
| WO | WO-2004/114391 | | 12/2004 |
| WO | WO-2011/111549 | | 9/2011 |

OTHER PUBLICATIONS

Tanaka.K et al., "45.5: A System LCD with Optical Input Function using Infra-Red Backlight Subtraction Scheme,", SID Digest '10 : SID International Symposium Digest of Technical Papers, 2010, pp. 680-683.

Jeon.S et al., "180nm Gate Length Amorphous InGaZnO Thin Film Transistor for High Density Image Sensor Applications,", IEDM 10: Technical Digest of International Electron Devices Meeting, Dec. 6, 2010, pp. 504-507.

Kim.S et al., "A Three-Dimensional Time-of-Flight CMOS Image Sensor With Pinned-Photodiode Pixel Structure,", IEEE Electron Device Letters, Nov. 1, 2010, vol. 31, No. 11, pp. 1272-1274.

Kim.S et al., "A 640−480 Image Sensor with Unified Pixel Architecture for 2D/3D Imaging in 0.11 μm CMOS,", 2011 Symposium on VLSI Technology : Digest of Technical Papers, Jun. 15, 2011, pp. 92-93.

Aoki.T et al., "Electronic Global Shutter CMOS Image Sensor Using Oxide Semiconductor FET With Extremely Low Off-State Current,", 2011 Symposium on VLSI Technology Digest of Technical Papers, 2011, pp. 174-175.

International Search Report (Application No. PCT/JP2013/055614) Dated Apr. 9, 2013.

Written Opinion (Application No. PCT/JP2013/055614) Dated Apr. 9, 2013.

Fortunato.E et al., "Wide-Bandgap High-Mobility ZnO Thin-Film Transistors Produced at Room Temperature,", Appl. Phys. Lett. (Applied Physics Letters) , Sep. 27, 2004, vol. 85, No. 13, pp. 2541-2543.

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using Cg-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters) , Jun. 26, 2007, vol. 90, No. 26, pp. 262106-1-262106-3.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTs,", SID Digest '08 : SID International Symposiuim of Technical Papers, May 20, 2008, vol. 39, pp. 621-624.

Prins.M et al., "A Ferroelectric Transparent Thin-Film Transistor,", Appl. Phys. Lett. (Applied Physics Letters) , Jun. 17, 1996, vol. 68, No. 25, pp. 3650-3652.

Nakamura.M et al., "The phase relations in the In2O3—Ga2ZnO4—ZnO system at 1350° C.,", Journal of Solid State Chemistry, Aug. 1, 1991, vol. 93, No. 2, pp. 298-315.

Kimizuka.N. et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics) , Feb. 1, 2003, vol. 93, No. 3, pp. 1624-1630.

Asakuma.N. et al., "Crystallization and Reduction of Sol-Gel-Derived Zinc Oxide Films by Irradiation With Ultraviolet Lamp,", Journal of Sol-Gel Science and Technology, 2003, vol. 26, pp. 181-184.

Osada.T et al., "15.2: Development of Driver-Integrated Panel using Amorphous In—Ga—Zn—Oxide TFT,", SID Digest '09 : SID International Symposium of Technical Papers, May 31, 2009, pp. 184-187.

Nomura.K et al., "Carrier transport in transparent oxide semiconductor with intrinsic structural randomness probed using single-crystalline InGaO3(ZnO)5 films,", Appl. Phys. Lett. (Applied Physics Letters) , Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO (Ga2O3—In2O3—ZnO) TFT,", SID Digest '08 : SID International Symposium Digest of Technical Papers, May 20, 2008, vol. 39, pp. 633-636.

Lee.J et al., "World'S Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDS,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MOO3 as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs ,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium—Gallium—Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits , 2008, vol. 43, No. 1, pp. 292-299.

Ohara.H et al., "Amorphous In—Ga—Zn—Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-Plane,", SID Digest '09 : SID International Symposium Digest of Technical Papers, May 31, 2009, pp. 280-283.

(56) References Cited

OTHER PUBLICATIONS

Lee.M et al., "15.4:Excellent Performance of Indium—Oxide-Based Thin-Film Transistors by DC Sputtering,", SID Digest '09 : SID International Symposium Digest of Technical Papers, May 31, 2009, pp. 191-193.
Jin.D et al., "65.2:Distinguished Paper:World-Largest (6.5") Flexible Full Color Top Emission AMOLED Display on Plastic Film and Its Bending Properties,", SID Digest '09 : SID International Symposium Digest of Technical Papers, May 31, 2009, pp. 983-985.
Sakata.J et al., "Development of 4.0-In. AMOLED Display With Driver Circuit Using Amorphous In—Ga—Zn—Oxide TFTS,", IDW '09 : Proceedings of the 16th International Display Workshops, 2009, pp. 689-692.
Park.J et al., "Amorphous Indium—Gallium—Zinc Oxide TFTS and Their Application for Large Size AMOLED,", AM-FPD '08 Digest of Technical Papers, Jul. 2, 2009, pp. 275-278.
Park.S et al., "Challenge to Future Displays: Transparent AM-OLED Driven by PEALD Grown ZnO TFT,", IMID '07 Digest, 2007, pp. 1249-1252.
Godo.H et al., "Temperature Dependence of Characteristics and Electronic Structure for Amorphous In—Ga—Zn—Oxide TFT,", AM-FPD '09 Digest of Technical Papers, Jul. 1, 2009, pp. 41-44.
Osada.T et al., "Development of Driver-Integrated Panel Using Amorphous In—Ga—Zn—Oxide TFT,", AM-FPD '09 Digest of Technical Papers, Jul. 1, 2009, pp. 33-36.
Hirao.T et al., "Novel Top-Gate Zinc Oxide Thin-Film Transistors (ZnO TFTS) for AMLCD,", Journal of the SID, 2007, vol. 15, No. 1, pp. 17-22.
Hosono.H, "68.3:Invited Paper:Transparent Amorphous Oxide Semiconductors for High Performance TFT,", SID Digest 07 : SID International Symposium Digest of Technical Papers, 2007, vol. 38, pp. 1830-1833.
Godo.H et al., "P-9:Numerical Analysis on Temperature Dependence of Characteristics of Amorphous In—Ga—Zn—Oxide TFT,", SID Digest '09 : SID International Symposium Digest of Technical Papers, May 31, 2009, pp. 1110-1112.
Ohara.H et al., "21.3:4.0 In. QVGA AMOLED Display Using In—Ga—Zn—Oxide TFTS With a Novel Passivation Layer,", SID Digest '09 : SID International Symposium Digest of Technical Papers, May 31, 2009, pp. 284-287.
Miyasaka.M, "SUFTLA Flexible Microelectronics on Their Way to Business,", SID Digest '07 : SID International Symposium Digest of Technical Papers, 2007, vol. 38, pp. 1673-1676.
Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.
Kikuchi.H et al., "39.1:Invited Paper:Optically Isotropic Nano-Structured Liquid Crystal Composites for Display Actions,", SID Digest '09 : SID International Symposium Digest of Technical Papers, May 31, 2009, pp. 578-581.
Asaoka.Y et al., "29.1: Polarizer-Free Reflective LCD Combined With Ultra Low-Power Driving Technology,", SID Digest '09 : SID International Symposium Digest of Technical Papers, May 31, 2009, pp. 395-398.
Lee.H et al., "Current Status of, Challenges to, and Perspective View of AM-OLED ,", IDW '06 : Proceedings of the 13th International Display Workshops, Dec. 7, 2006, pp. 663-666.
Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.
Nakamura.M, "Synthesis of Homologous Compound with New Long-Period Structure,", NIRIM Newsletter, Mar. 1, 1995, vol. 150, pp. 1-4.
Kikuchi.H et al., "Polymer-Stabilized Liquid Crystal Blue Phases,", Nature Materials, Sep. 2, 2002, vol. 1, pp. 64-68.
Kimizuka.N. et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu, or Zn] at Temperatures over 1000° C.,", Journal of Solid State Chemistry, 1985, vol. 60, pp. 382-384.
Kitzerow.H et al., "Observation of Blue Phases in Chiral Networks,", Liquid Crystals, 1993, vol. 14, No. 3, pp. 911-916.
Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.
Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.
Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.
Orita.M et al., "Mechanism of Electrical Conductivity of Transparent InGaZnO4,", Phys. Rev. B (Physical Review. B), Jan. 15, 2000, vol. 61, No. 3, pp. 1811-1816.
Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, pp. 4303-4308.
Janotti.A et al., "Native Point Defects in ZnO,", Phys. Rev. B (Physical Review. B), Oct. 4, 2007, vol. 76, No. 16, pp. 165202-1-165202-22.
Park.J et al., "Electronic Transport Properties of Amorphous Indium—Gallium—Zinc Oxide Semiconductor Upon Exposure to Water,", Appl. Phys. Lett. (Applied Physics Letters) , 2008, vol. 92, pp. 072104-1-072104-3.
Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.
Janotti.A et al., "Oxygen Vacancies in ZnO,", Appl. Phys. Lett. (Applied Physics Letters) , 2005, vol. 87, pp. 122102-1-122102-3.
Oba.F et al., "Defect energetics in ZnO: A hybrid Hartree-Fock density functional study,", Phys. Rev. B (Physical Review. B), 2008, vol. 77, pp. 245202-1-245202-6.
Orita.M et al., "Amorphous transparent conductive oxide InGaO3(ZnO)m (m<4):a Zn4s conductor,", Philosophical Magazine, 2001, vol. 81, No. 5, pp. 501-515.
Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.
Mo.Y et al., "Amorphous Oxide TFT Backplanes for Large Size Amoled Displays,", IDW '08 : Proceedings of the 6th International Display Workshops, Dec. 3, 2008, pp. 581-584.
Kim.S et al., "High-Performance oxide thin film transistors passivated by various gas plasmas,", 214th ECS Meeting, 2008, No. 2317, ECS.
Clark.S et al., "First Principles Methods Using Castep,", Zeitschrift fur Kristallographie, 2005, vol. 220, pp. 567-570.
Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.
Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.
Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.
Ueno.K et al., "Field-Effect Transistor on SrTiO3 With Sputtered Al2O3 Gate Insulator,", Appl. Phys. Lett. (Applied Physics Letters) , Sep. 1, 2003, vol. 83, No. 9, pp. 1755-1757.

* cited by examiner

12_(k−1)(TX_(k−1))
12_(k)(TX_(k))
15_(k−1)
15_(k)
13_(k−1)(SE_(k−1))
13_(k)(SE_(k))
11_(k−1)(PR_(k−1))
11_(k)(PR_(k))
16_(k)
16_(k−1)
100_(k)
100_(k−1)
102_(k)
103_(k)
104_(k)
105_(k)
14_(k)
102_(k−1)
103_(k−1)
104_(k−1)
105_(k−1)
14_(k−1)

12B(TX_3)
12A(TX_2)
15
100A
110
13A(SE_2)
13B(SE_3)
11A(PR_2)
11B(PR_3)
16A
16B
100B
104A
105A
103A
14A
102A
102B
103B
14B
104B
105B 301
302
PR
TX
SE
FD
16
H
L
T1 T2 T3 T4 T5 T6 T7 T8 T9
T10 T11 T12 T13 T14 T15 T16 T17 T18 T19 T20 T21 T22 T23 T24 T25 T26 T27
T
ΔT
V1
V2
VS1
VS2

T1 T2 T3 T4 T5 T6 T7 T8 T9 T10 T11 T12 T13 T14 T15
301
302
11_(k−1)(PR_(k−1))
12_(k−1)(TX_(k−1))
13_(k−1)(SE_(k−1))
14_(k−1)(FD_(k−1))
16_(k−1)
11_(k)(PR_(k))
12_(k)(TX_(k))
13_(k)(SE_(k))
14_(k)(FD_(k))
16_(k)
H
L
T
ΔT
$V_1$
$V_2$
$V_{S1}$
$V_{S2}$ 402
403
404
405
411
412
413
414
415
416
417
418
419
420
420a
420b
421
421a
421b
422
422a
422b
423
424
425
426
427
428
430
431
432
433
434
435
436
437
440
441
442
443
444
445
446
447
448
449
450
451
452
453
454
455
456
457
458
459
460
460n
460i
460p
461
462
463

11A(PR_2)
246(11B, PR_3)
255(16B)
14B(FD_3)
254
252
14A(FD_2)
16A
104B
105B
A1
A2
103B
246
B2
B1
A3
A4
102B
102A
105A
13B(SE_3)
12B(TX_3)
13A(SE_2)
12A(TX_2)
108(15)
104A
247
103A

METHOD FOR DRIVING SEMICONDUCTOR DEVICE

TECHNICAL FIELD

The present invention relates to methods for driving semiconductor devices including optical sensors.

Note that in this specification, a semiconductor device generally means a device that can function by utilizing semiconductor characteristics. An electrooptic device, a semiconductor circuit, and an electronic device are all semiconductor devices.

BACKGROUND ART

In recent years, methods for measuring three-dimensional (3D) ranges by which not only shape information on an object but also range information on the object can be acquired have been used in many fields. The methods are mainly classified into two methods: active measurement and passive measurement. In active measurement, an object is irradiated with light, an electric wave, a sonic wave, or the like, and obtained information is used. In passive measurement, an object is not irradiated with specific light, a specific electric wave, or the like that is used as an aid in measurement.

As passive measurement, stereo matching or the like can be used. As active measurement, a time of flight (TOF) method, photo cutting, or the like can be used. In stereo matching, different images are taken by a plurality of optical sensors, and range information is acquired according to the triangulation principle. In Patent Document 1, by performing stereo matching on a region that is smaller than a region common to different images, measurement time is shortened and measurement accuracy is increased.

In the TOF method, an object is irradiated with infrared light for a certain period, and reflected light is detected by an optical sensor in each pixel. Utilizing a difference between light irradiation start time and arrival time of reflected light at an optical sensor, range information is calculated from an irradiation period, a detection signal, and light speed. In Non-Patent Document 1, two detection signals are acquired by two infrared light irradiations. One of the advantages of the TOF method is the ease of downsizing of a semiconductor device.

In Patent Document 2, by alternately performing two-dimensional (2D) imaging and 3D imaging every other frame period, 2D information (the intensity, color, or the like of light reflected from an object) and 3D information (a distance from a light source to the object) are acquired using one pixel.

REFERENCE

Patent Documents

Patent Document 1: Japanese Published Patent Application No. 2008-059148

Patent Document 2: Japanese Published Patent Application No. 2010-035168

Non-Patent Document

Non-Patent Document 1: S. J. Kim et al, "A Three-Dimensional Time-of-Flight CMOS Image Sensor With Pinned-Photodiode Pixel Structure", IEEE Electron Device Letters, November 2010, Vol. 31, No. 11, pp. 1272-1274

DISCLOSURE OF INVENTION

In stereo matching, in order to acquire high-precision range information, it is necessary to increase matching accuracy. An increase in matching throughput leads to a large increase in measurement time. Further, it is difficult to downsize a semiconductor device because a plurality of optical sensors are away from each other.

A TOF method has a problem in that in the case where a detection signal for calculating range information is acquired by one infrared light irradiation, the accuracy of the detection signal is decreased.

In Non-Patent Document 1, there is a time lapse after acquisition of a first detection signal and before acquisition of a second detection signal. In the case where an object moves, the detection signals are slightly changed due to the time lapse; thus, it is difficult to maintain the accuracy of range information.

In Patent Document 2, it is necessary to switch a frame period between 2D imaging and 3D imaging. Thus, there is a time lapse after acquisition of information by 2D imaging and before acquisition of information by 3D imaging. Consequently, it is difficult to obtain both the pieces of information concurrently, which is problematic.

In view of the problems, it is an object to provide a semiconductor device capable of acquiring high-precision range information in a short time. It is an object to provide a semiconductor device capable of acquiring high-precision range information in a short time even when an object moves. It is an object to provide a semiconductor device capable of acquiring high-precision range information and image information concurrently in a short time.

It is an object to downsize a semiconductor device.

In one embodiment of the present invention, the accuracy of range information is increased by performing infrared light irradiation more than once to acquire one detection signal and making infrared light irradiation periods identical and extremely short.

One embodiment of the present invention disclosed in this specification is a method for driving a semiconductor device that includes a pixel including a photoelectric conversion element and a first transistor accumulating signal electric charge in an FD node based on the amount of light delivered to the photoelectric conversion element, and a signal processing circuit for performing arithmetic processing based on a detection signal output from an output line. The method includes the following steps: supplying a potential for making the FD node have a first high potential to one electrode of the photoelectric conversion element; delivering infrared light from a light source to an object in a period T; making at least the potential of a gate electrode of the first transistor a second high potential in a first period from a time at which light that arrives at the object and is reflected starts to enter the photoelectric conversion element until a time at which the light source stops the infrared light irradiation n (n is a natural number of 2 or more) times; acquiring a first detection signal based on a first potential difference between the potential of the FD node and a low potential after the n-th first period from the output line; supplying a potential for making the FD node have the first high potential to one electrode of the photoelectric conversion element after acquiring the first detection signal; delivering the infrared light from the light source to the object in the period T; making at least the potential of the gate electrode of the first transistor the second high potential in a second period from a time at which the light source stops the infrared light irradiation until a time at which entry of light that arrives at the object and is reflected into the photoelectric conversion element is terminated the n times; acquiring a second detection signal based on a second potential difference between the potential of the FD node and the low potential after the n-th second period from the output line; after acquiring the second detection signal, calculating a distance between the photoelectric conversion element and the object by performing arithmetic processing of Formula (1) by a signal processing circuit, where light speed, the first detection signal, and the second detection signal are denoted by c, $S_1$, and $S_2$, respectively.

$$x = \frac{c \times T \times S_2}{2 \times (S_1 + S_2)} \quad (1)$$

One embodiment of the present invention disclosed in this specification is a method for driving a semiconductor device that includes a pixel including a photoelectric conversion element, a first transistor accumulating signal electric charge in an FD node based on the amount of light delivered to the photoelectric conversion element, a second transistor amplifying a signal potential converted based on the amount of the accumulated signal electric charge, and a third transistor outputting a detection signal based on the amplified signal potential from an output line, and a signal processing circuit for performing arithmetic processing based on the detection signal output from the output line. The method includes the following steps: supplying a potential for making the FD node have a first high potential to one electrode of the photoelectric conversion element; delivering infrared light from a light source to an object in a period T; making at least the potential of a gate electrode of the first transistor a second high potential in a first period from a time at which light that arrives at the object and is reflected starts to enter the photoelectric conversion element until a time at which the light source stops the infrared light irradiation n (n is a natural number of 2 or more) times; after making at least the potential of the gate electrode of the first transistor the second high potential in the first period the n times, amplifying the potential of the FD node after the n-th first period by the second transistor; supplying a potential for making a gate electrode of the third transistor have a third high potential; changing the potential of the output line by turning on the second transistor and the third transistor, and then supplying a potential for making the gate electrode of the third transistor have a low potential; outputting a first potential difference between the potential of the output line and the low potential after supply of the low potential from the output line; after outputting the first potential difference, acquiring a first detection signal based on the first potential difference; supplying a potential for making the FD node have the first high potential to one electrode of the photoelectric conversion element after acquiring the first detection signal; delivering the infrared light from the light source to the object in the period T; making at least the potential of the gate electrode of the first transistor the second high potential in a second period from a time at which the light source stops the infrared light irradiation until a time at which entry of light that arrives at the object and is reflected into the photoelectric conversion element is terminated the n times; after making at least the potential of the gate electrode of the first transistor the second high potential in the second period the n times, amplifying the potential of the FD node after the n-th second period by the second transistor; supplying a potential for making the gate electrode of the third transistor have the third high potential, changing the potential of the output line by turning on the second transistor and the third transistor, and then supplying a potential for making the gate electrode of the third transistor have the low potential; outputting a second potential difference between the potential of the output line and the low potential after supply of the low potential from the output line; after outputting the second potential difference, acquiring a second detection signal based on the second potential difference; after acquiring the second detection signal, calculating a distance between the photoelectric conversion element and the object by performing arithmetic processing of Formula (1) by a signal processing circuit, where light speed, the first detection signal, and the second detection signal are denoted by c, $S_1$, and $S_2$, respectively.

$$x = \frac{c \times T \times S_2}{2 \times (S_1 + S_2)} \quad (1)$$

In one embodiment of the present invention, infrared light irradiation is performed more than once to acquire two detection signals, light reflected from an object in each infrared light irradiation is detected by adjacent photodiodes with no time difference, and infrared light irradiation periods are made identical and extremely short. Thus, the accuracy of range information is increased.

One embodiment of the present invention disclosed in this specification is a method for driving a semiconductor device that includes a plurality of pixels including a photoelectric conversion element and an accumulation transistor accumulating signal electric charge in an FD node based on the amount of light delivered to the photoelectric conversion element, and a signal processing circuit for performing arithmetic processing based on a detection signal output from an output line. The method includes the following steps: delivering infrared light from a light source to an object in a period T; supplying a potential for making a first FD node have a high potential to one electrode of a first photoelectric conversion element before a first time at which light that arrives at the object and is reflected starts to enter the first photoelectric conversion element and a second photoelectric conversion element adjacent to the first photoelectric conversion element; making at least the potential of a gate electrode of a first accumulation transistor a high potential in a period from the first time until a second time at which the light source stops the infrared light irradiation; supplying a potential for making a second FD node have a high potential to one electrode of the second photoelectric conversion element before the second time; making at least the potential of a gate electrode of a second accumulation transistor a high potential in a period from the second time until a third time at which entry of light that arrives at the object and is reflected into the first photoelectric conversion element and the second photoelectric conversion element is terminated n (n is a natural number of 2 or more) times; after making at least the potential of the gate electrode of the second accumulation transistor a high potential in the period the n times, acquiring a first detection signal based on a first potential difference between the potential of the first FD node and a low potential after the n-th third time from a first output line; acquiring a second detection signal based on a second potential difference between the potential of the second FD node and the low potential after the n-th third time from a second output line; after acquiring the first detection signal and the second detection signal, calculating a distance between the photoelectric conversion element and the object by performing arithmetic processing of Formula (1) by a signal processing circuit, where light speed, the first detection signal, and the second detection signal are denoted by c, $S_1$, and $S_2$, respectively.

$$x = \frac{c \times T \times S_2}{2 \times (S_1 + S_2)} \quad (1)$$

One embodiment of the present invention disclosed in this specification is a method for driving a semiconductor device that includes a plurality of pixels including a photoelectric conversion element, an accumulation transistor accumulating signal electric charge in an FD node based on the amount of light delivered to the photoelectric conversion element, an amplifier transistor amplifying a signal potential converted based on the amount of the accumulated signal electric charge, and an output transistor outputting a detection signal based on the amplified signal potential from an output line, and a signal processing circuit for performing arithmetic processing based on the detection signal output from the output line. The method includes the following steps: delivering infrared light from a light source to an object in a period T; supplying a potential for making a first FD node have a high potential to one electrode of a first photoelectric conversion element before a first time at which light that arrives at the object and is reflected starts to enter the first photoelectric conversion element and a second photoelectric conversion element adjacent to the first photoelectric conversion element; making at least the potential of a gate electrode of a first accumulation transistor a high potential in a period from the first time until a second time at which the light source stops the infrared light irradiation; supplying a potential for making a second FD node have a high potential to one electrode of the second photoelectric conversion element before the second time; making at least the potential of a gate electrode of a second accumulation transistor a high potential in a period from the second time until a third time at which entry of light that arrives at the object and is reflected into the first photoelectric conversion element and the second photoelectric conversion element is terminated n (n is a natural number of 2 or more) times; after making at least the potential of the gate electrode of the second accumulation transistor a high potential in the period the n times, amplifying the potential of the first FD node after the n-th third time by a first amplifier transistor; supplying a potential for making a gate electrode of a first output transistor have a high potential, changing the potential of a first output line by turning on the first amplifier transistor and the first output transistor, and then supplying a potential for making the gate electrode of the first output transistor have a first low potential; outputting a first potential difference between the potential of the first output line and the first low potential after supply of the first low potential from the first output line; amplifying the potential of the second FD node after the n-th third time by a second amplifier transistor; supplying a potential for making a gate electrode of a second output transistor have a high potential, changing the potential of a second output line by turning on the second amplifier transistor and the second output transistor, and then supplying a potential for making the gate electrode of the second output transistor have a second low potential; outputting a second potential difference between the potential of the second output line and the second low potential after supply of the second low potential from the second output line; after outputting the first potential difference and the second potential difference from the first output line and the second output line, respectively, acquiring a first detection signal and a second detection signal based on the first potential difference and the second potential difference, respectively; after acquiring the first detection signal and the second detection signal, calculating a distance between the photoelectric conversion element and the object by performing arithmetic processing of Formula (1) by a signal processing circuit, where light speed, the first detection signal, and the second detection signal are denoted by c, $S_1$, and $S_2$, respectively.

$$x = \frac{c \times T \times S_2}{2 \times (S_1 + S_2)} \quad (1)$$

In the above method, it is preferable that the plurality of pixels included in the semiconductor device each calculate a distance between the photoelectric conversion element and the object.

In one embodiment of the present invention, the accuracy of range information is increased by performing infrared light irradiation more than once to acquire one detection signal and making infrared light irradiation periods identical and extremely short. A first optical sensor absorbing visible light and transmitting infrared light and a second optical sensor absorbing infrared light overlap with each other. The first optical sensor first absorbs visible light, and the second optical sensor absorbs mainly infrared light. Thus, the size of the pixels in the semiconductor device can be reduced, and 2D imaging and 3D imaging can be performed concurrently.

One embodiment of the present invention disclosed in this specification is a method for driving a semiconductor device that includes a plurality of pixels including a first photoelectric conversion element, a second photoelectric conversion element, a first accumulation transistor accumulating signal electric charge in a first FD node based on the amount of visible light delivered to the first photoelectric conversion element, and a second accumulation transistor accumulating signal electric charge in a second FD node based on the amount of infrared light delivered to the second photoelectric conversion element, and a signal processing circuit for performing arithmetic processing based on a detection signal output from a first output line and a second output line. The method includes the following steps: supplying a potential for making the second FD node have a first high potential to one electrode of the second photoelectric conversion element overlapping with the first photoelectric conversion element; delivering infrared light from a light source to an object in a period T; making at least the potential of a gate electrode of the second accumulation transistor a second high potential in a first period from a time at which the infrared light that arrives at the object and is reflected starts to enter the second photoelectric conversion element until a time at which the light source stops the infrared light irradiation n (n is a natural number of 2 or more) times; acquiring a first detection signal based on a first potential difference between the potential of the second FD node and a low potential after the n-th first period from the second output line; supplying a potential for making the second FD node have the first high potential to one electrode of the second photoelectric conversion element after acquiring the first detection signal; delivering the infrared light from the light source to the object in the period T; making at least the potential of the gate electrode of the second accumulation transistor the second high potential in a second period from a time at which the light source stops the infrared light irradiation until a time at which entry of the infrared light that arrives at the object and is reflected into the second photoelectric conversion element is terminated the n times; acquiring a second detection signal based on a second potential difference between the potential of the second FD node and a low potential after the n-th second period from the second output line; supplying a potential for making the first FD node have a third high potential to one electrode of the first photoelectric conversion element; making at least the potential of a gate electrode of the first accumulation transistor a fourth high potential in a third period from a time at which infrared light by first irradiation arrives at the object, is reflected, and starts to enter the first photoelectric conversion element and the second photoelectric conversion element until a time at which infrared light by the last irradiation arrives at the object, is reflected, and finishes entering the first photoelectric conversion element and the second photoelectric conversion element; acquiring a third detection signal based on a third potential difference between the potential of the first FD node and a low potential after the third period from the first output line; after acquiring the second detection signal, calculating a distance between the second photoelectric conversion element and the object by performing arithmetic processing of Formula (1) by a signal processing circuit, where light speed, the first detection signal, and the second detection signal are denoted by c, $S_1$, and $S_2$, respectively; and obtaining an image of the object based on the third detection signal in each pixel after acquiring the third detection signal.

$$x = \frac{c \times T \times S_2}{2 \times (S_1 + S_2)} \quad (1)$$

One embodiment of the present invention disclosed in this specification is a method for driving a semiconductor device that includes a plurality of pixels including a first photoelectric conversion element, a second photoelectric conversion element, a first accumulation transistor accumulating first signal electric charge in a first FD node based on the amount of visible light delivered to the first photoelectric conversion element, a first amplifier transistor amplifying a first signal potential converted based on the amount of the accumulated first signal electric charge, a first output transistor outputting a detection signal based on the amplified first signal potential from a first output line, a second accumulation transistor accumulating second signal electric charge in a second FD node based on the amount of infrared light delivered to the second photoelectric conversion element, a second amplifier transistor amplifying a second signal potential converted based on the amount of the accumulated second signal electric charge, and a second output transistor outputting a detection signal based on the amplified second signal potential from a second output line, and a signal processing circuit for performing arithmetic processing based on the detection signals output from the first output line and the second output line. The method includes the following steps: supplying a potential for making the second FD node have a first high potential to one electrode of the second photoelectric conversion element overlapping with the first photoelectric conversion element; delivering infrared light from a light source to an object in a period T; making at least the potential of a gate electrode of the second accumulation transistor a second high potential in a first period from a time at which the infrared light that arrives at the object and is reflected starts to enter the second photoelectric conversion element until a time at which the light source stops the infrared light irradiation n (n is a natural number of 2 or more) times; after making at least the potential of the gate electrode of the second accumulation transistor the second high potential in the first period the n times, amplifying the potential of the second FD node after the n-th first period by the second amplifier transistor; supplying a potential for making a gate electrode of the second output transistor have a third high potential, changing the potential of the second output line by turning on the second amplifier transistor and the second output transistor, and then supplying a potential for making the gate electrode of the second output transistor have a first low potential; outputting a first potential difference between the potential of the second output line and the first low potential after supply of the first low potential from the second output line; acquiring a first detection signal based on the first potential difference after outputting the first potential difference; supplying a potential for making the second FD node have the first high potential to one electrode of the second photoelectric conversion element after acquiring the first detection signal; delivering the infrared light from the light source to the object in the period T; making at least the potential of the gate electrode of the second accumulation transistor the second high potential in a second period from a time at which the light source stops the infrared light irradiation until a time at which entry of the infrared light that arrives at the object and is reflected into the second photoelectric conversion element is terminated the n times; after making at least the potential of the gate electrode of the second accumulation transistor the second high potential in the second period the n times, amplifying the potential of the second FD node after the n-th second period by the second amplifier transistor; supplying a potential for making the gate electrode of the second output transistor have the third high potential, changing the potential of the second output line by turning on the second amplifier transistor and the second output transistor, and then supplying a potential for making the gate electrode of the second output transistor have the first low potential; outputting a second potential difference between the potential of the second output line and the first low potential after supply of the first low potential from the second output line; acquiring a second detection signal based on the second potential difference after outputting the second potential difference; supplying a potential for making the first FD node have a fourth high potential to one electrode of the first photoelectric conversion element; making at least the potential of a gate electrode of the first accumulation transistor a fifth high potential in a third period from a time at which infrared light by first irradiation arrives at the object, is reflected, and starts to enter the first photoelectric conversion element and the second photoelectric conversion element until a time at which infrared light by the last irradiation arrives at the object, is reflected, and finishes entering the first photoelectric conversion element and the second photoelectric conversion element; amplifying the potential of the first FD node after the third period by the first amplifier transistor; supplying a potential for making a gate electrode of the first output transistor have a sixth high potential, changing the potential of the first output line by turning on the first amplifier transistor and the first output transistor, and then supplying a potential for making the gate electrode of the first output transistor have the second low potential; outputting a third potential difference between the potential of the first output line and the second low potential after supply of the second low potential from the first output line; acquiring a third detection signal based on the third potential difference after outputting the third potential difference; after acquiring the second detection signal, calculating a distance between the second photoelectric conversion element and the object by performing arithmetic processing of Formula (1) by a signal processing circuit, where light speed, the first detection signal, and the second detection signal are denoted by c, $S_1$, and $S_2$, respectively; and obtaining an image of the object based on the third detection signal in each pixel after acquiring the third detection signal.

$$x = \frac{c \times T \times S_2}{2 \times (S_1 + S_2)} \quad (1)$$

In the above method, it is preferable that the plurality of pixels included in the semiconductor device each calculate a distance between the second photoelectric conversion element and the object.

In the above method, the light source may be provided inside or outside the semiconductor device.

In the above method, an irradiation controller may be provided inside the semiconductor device. The irradiation controller sets a period from a time at which infrared light irradiation starts until a time at which the infrared light irradiation stops and the number of infrared light irradiations, and can output a pulsed signal synchronized with the light source based on the set values.

Note that in this specification, a delay period means a difference between a time at which irradiation of an object with light from a light source starts and a time at which light reflected from the object starts to enter an optical sensor.

By acquiring a detection signal using a delay period generated in each infrared light irradiation, higher-precision range information can be acquired. By continuously detecting lights reflected from the same point by adjacent photodiodes, the accuracy of range information can be maintained even when an object moves fast. By detecting visible light in a period during which range information is acquired, range information and image information can be acquired concurrently.

BEST MODE FOR CARRYING OUT THE INVENTION

Figure 1A:
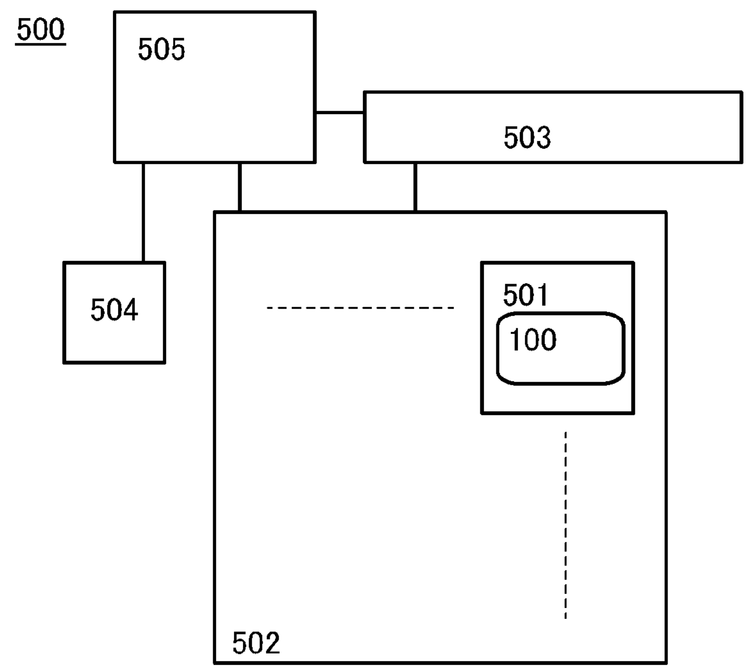
FIGS. 1A to 1C illustrate a semiconductor device.

Embodiments will be described in detail with reference to the drawings. Note that the present invention is not limited to the following description. It will be readily appreciated by those skilled in the art that modes and details of the present invention can be modified in various ways without departing from the spirit and scope of the present invention. The present invention therefore should not be construed as being limited to the following description of the embodiments. Note that in structures of the present invention described below, the same portions or portions having similar functions are denoted by the same reference numerals in different drawings, and a description thereof is not repeated.

Embodiment 1

The structure of a semiconductor device 500 in one embodiment of the invention disclosed in this specification is described with reference to FIGS. 1A to 1C. The semiconductor device 500 acquires range information on the entire object by using a distance between each optical sensor 100 to be described later and a certain point of the object that is calculated based on a detection signal output from each optical sensor 100.

<Structure of Semiconductor Device 500>

As illustrated in FIG. 1A, the semiconductor device 500 includes at least a light receiving portion 502 and a signal processing circuit 503. The light receiving portion 502 includes a plurality of pixels 501 arranged in matrix. Each pixel 501 includes one optical sensor 100.

A light source 504 and an irradiation controller 505 may be provided inside or outside the semiconductor device 500.

Figure 1B:
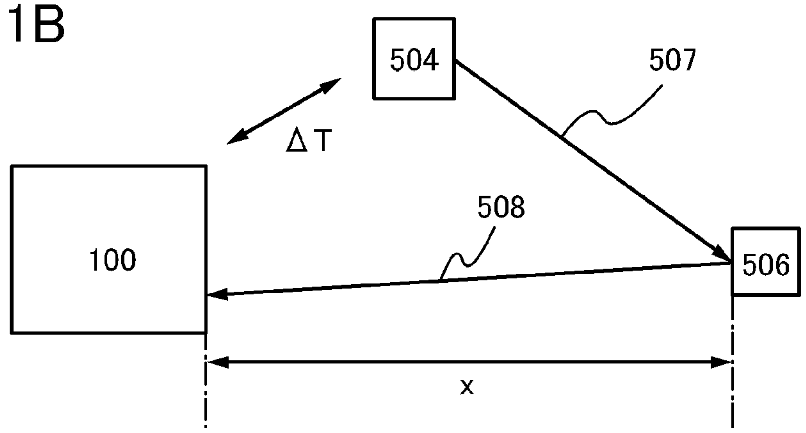

As illustrated in FIG. 1B, an object 506 is irradiated with infrared light 507 (irradiation light) from the light source 504, and light that arrives at the object 506 and is reflected (reflected light 508) enters each optical sensor 100 included in the semiconductor device 500.

The light receiving portion 502 outputs a detection signal corresponding to the light amount based on a pulsed signal from the irradiation controller 505 to the signal processing circuit 503.

The signal processing circuit 503 determines the amount of the reflected light 508, calculates a time for infrared light from the light source 504 to arrive at the light receiving portion 502 (a delay period $\Delta T$), and computes a distance x between each optical sensor 100 and a certain point of an object using the delay period $\Delta T$. The result of computation by the signal processing circuit 503 is, for example, output to a display device (not illustrated).

The light source 504 irradiates an object with infrared light under an instruction from the irradiation controller 505. Note that it is preferable that infrared light irradiation be performed more than once and that infrared light irradiation periods be identical and extremely short.

Note that visible light may enter the light receiving portion 502.

<Structure Example 1 of Optical Sensor>

Figure 2:
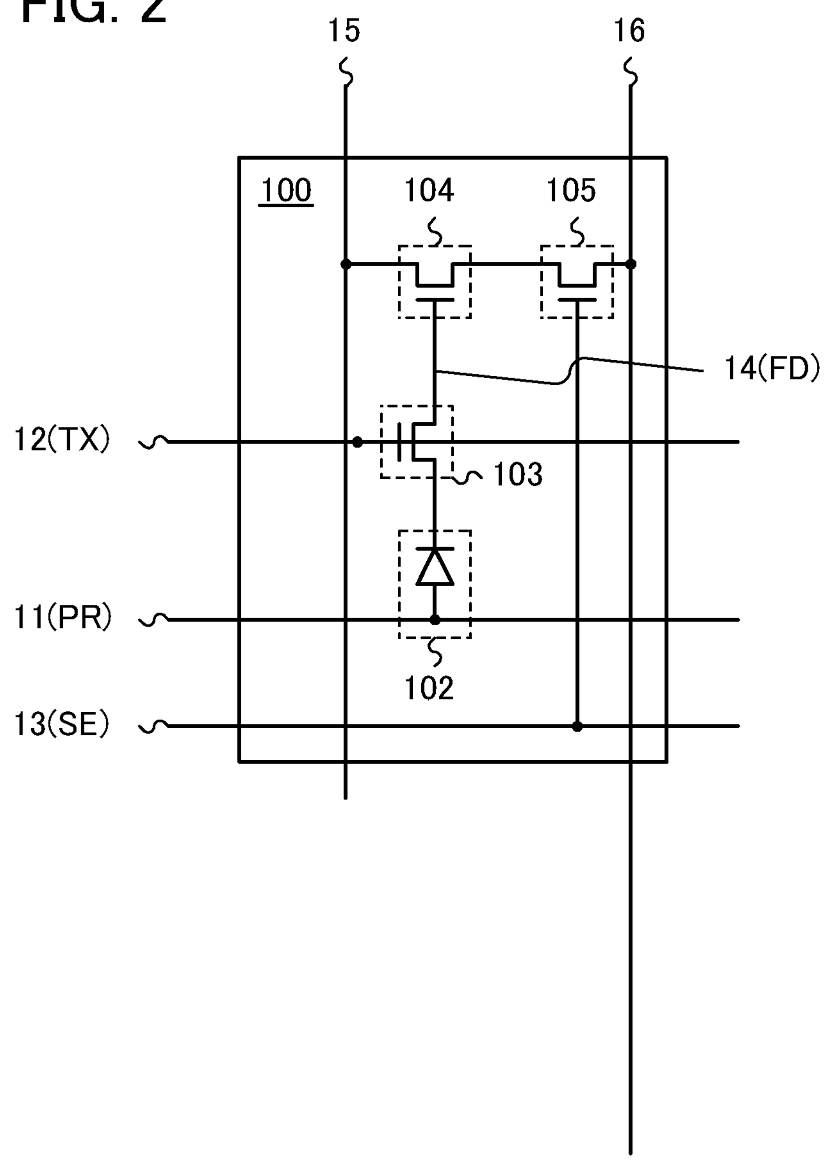
FIG. 2 illustrates an optical sensor.

Next, a structure example of the optical sensor 100 included in the semiconductor device in one embodiment of the invention disclosed in this specification is described with reference to FIG. 2. FIG. 2 is a circuit diagram of the optical sensor 100. Note that the structure of the optical sensor 100 is not limited to this structure, and the optical sensor 100 may include at least one photodiode and one transistor.

As illustrated in FIG. 2, the optical sensor 100 includes a photodiode 102, a transistor 103, a transistor 104, and a transistor 105.

The optical sensor 100 in FIG. 2 includes three transistors and one photodiode. A reduction in the number of elements in the optical sensor 100 leads to a reduction in pixel size and facilitates downsizing of the semiconductor device.

In FIG. 2, a signal line 11, a signal line 12, a signal line 13, a node 14, a signal line 15, and a signal line 16 are a reset signal line (PR), an electric charge accumulation signal line (TX), a selection signal line (SE), a floating diffusion (FD) node, an optical sensor reference signal line, and an optical sensor output signal line, respectively.

Note that in this specification, the photodiode 102 is irradiated with at least infrared light.

The photodiode 102 functions as a photoelectric conversion element detecting light entering the diode and generating electric charge. The amount of electric charge to be generated depends on the amount of incident light.

The transistor 103 functions as a transistor controlling imaging. In other words, the transistor 103 functions as a transistor controlling the amount of electric charge to be accumulated in the node 14 based on the amount of light delivered to the photodiode 102.

As illustrated in FIG. 2, in the optical sensor 100, an anode of the photodiode 102 is electrically connected to the signal line 11. A cathode of the photodiode 102 is electrically connected to one of a source electrode and a drain electrode of the transistor 103. The other of the source electrode and the drain electrode of the transistor 103 is electrically connected to a gate electrode of the transistor 104 and the node 14. One of a source electrode and a drain electrode of the transistor 104 is electrically connected to the signal line 15. One of a source electrode and a drain electrode of the transistor 105 is electrically connected to the signal line 16. The other of the source electrode and the drain electrode of the transistor 104 is electrically connected to the other of the source electrode and the drain electrode of the transistor 105. A gate electrode of the transistor 103 is electrically connected to the signal line 12. A gate electrode of the transistor 105 is electrically connected to the signal line 13.

FIG. 2 illustrates a structure where the anode of the photodiode 102 is electrically connected to the signal line 11 and the cathode of the photodiode 102 is electrically connected to one of the source electrode and the drain electrode of the transistor 103; however, the present invention is not limited thereto. The cathode of the photodiode 102 may be electrically connected to the signal line 11, and the anode of the photodiode 102 may be electrically connected to one of the source electrode and the drain electrode of the transistor 103.

<Structure Example 2 of Optical Sensor>

Figure 3:
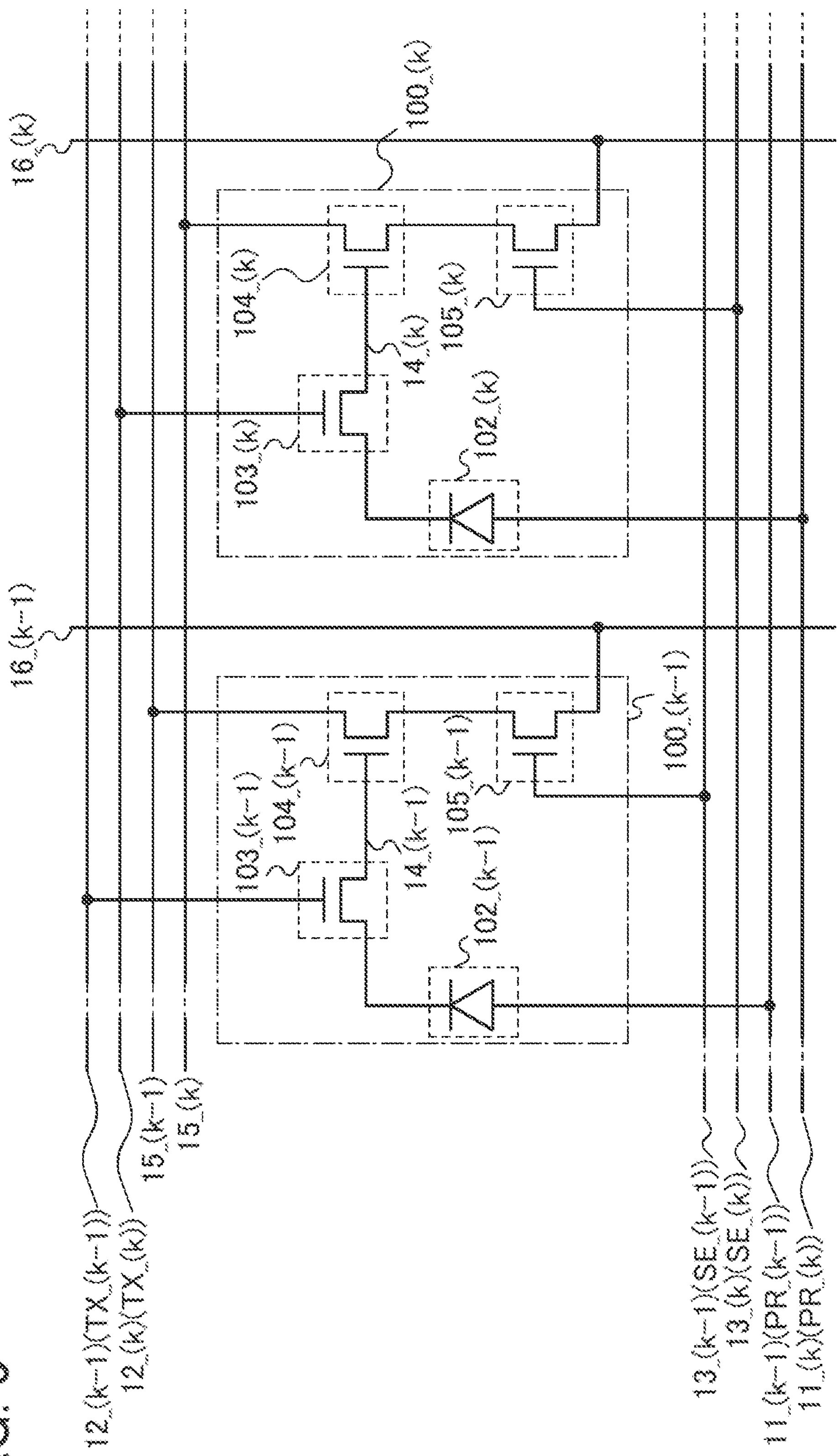
FIG. 3 illustrates an optical sensor.

In the semiconductor device in one embodiment of the invention disclosed in this specification, the optical sensors 100 may be arranged in a matrix of m (row)×n (column) (m and n are each a natural number of 2 or more). In FIG. 3, optical sensors adjacent to each other in a column direction are referred to as, for example, an optical sensor 100($k$−1) (k is a natural number of 2 or more and n or less) and an optical sensor 100($k$).

The optical sensor 100($k$−1) includes a photodiode 102($k$−1), a transistor 103($k$−1), a transistor 104($k$−1), and a transistor 105($k$−1). The optical sensor 100($k$) includes a photodiode 102($k$), a transistor 103($k$), a transistor 104($k$), and a transistor 105($k$).

<Structure Example 3 of Optical Sensor>

The semiconductor device in one embodiment of the invention disclosed in this specification includes one optical sensor 100A and one optical sensor 100B as optical sensors. In the semiconductor device 500 including these optical sensors in each pixel, image information on the entire object can be acquired based on a detection signal output from each optical sensor 100A, and at the same time of acquisition of the image information, range information on the entire object can be acquired using a distance between each optical sensor 100B and a certain point of the object that is calculated based on a detection signal output from each optical sensor 100B.

Figure 1C:
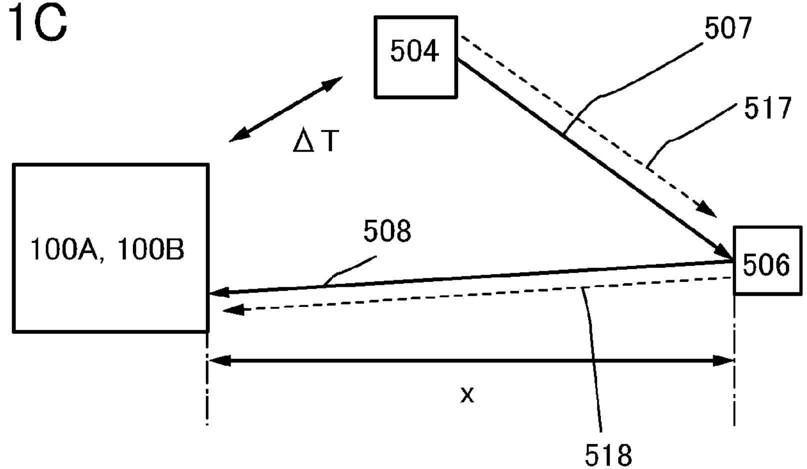

As illustrated in FIG. 1C, the object 506 is irradiated with the infrared light 507 and visible light 517 from the light source 504, and light that arrives at the object 506 and is reflected (reflected light) enters each optical sensor 100A and each optical sensor 100B included in the semiconductor device 500. Note that the optical sensor 100A absorbs visible light 518 in the reflected light, and the optical sensor 100B absorbs the reflected light 508 that is infrared light (also referred to as infrared reflected light).

Note that in this specification, a photodiode 102A absorbs light in a specific wavelength region, for example, visible light, and transmits light other than the light in the specific wavelength region, for example, infrared light. In addition, a photodiode 102B absorbs light in a specific wavelength region, for example, visible light, and light other than the light in the specific wavelength region, for example, infrared light.

The signal processing circuit 503 determines the amount of infrared reflected light absorbed by each optical sensor 100B, calculates the time for infrared light from the light source 504 to arrive at the light receiving portion 502 (the delay period ΔT), and computes the distance x between each optical sensor 100B and a certain point of the object using the delay period ΔT. The result of computation by the signal processing circuit 503 is, for example, output to a display device (not illustrated).

Note that in the light receiving portion 502, the optical sensor 100A and the optical sensor 100B overlap with each other, and most of the visible light 518 reflected off the object 506 is first absorbed by the optical sensor 100A.

Figure 4:
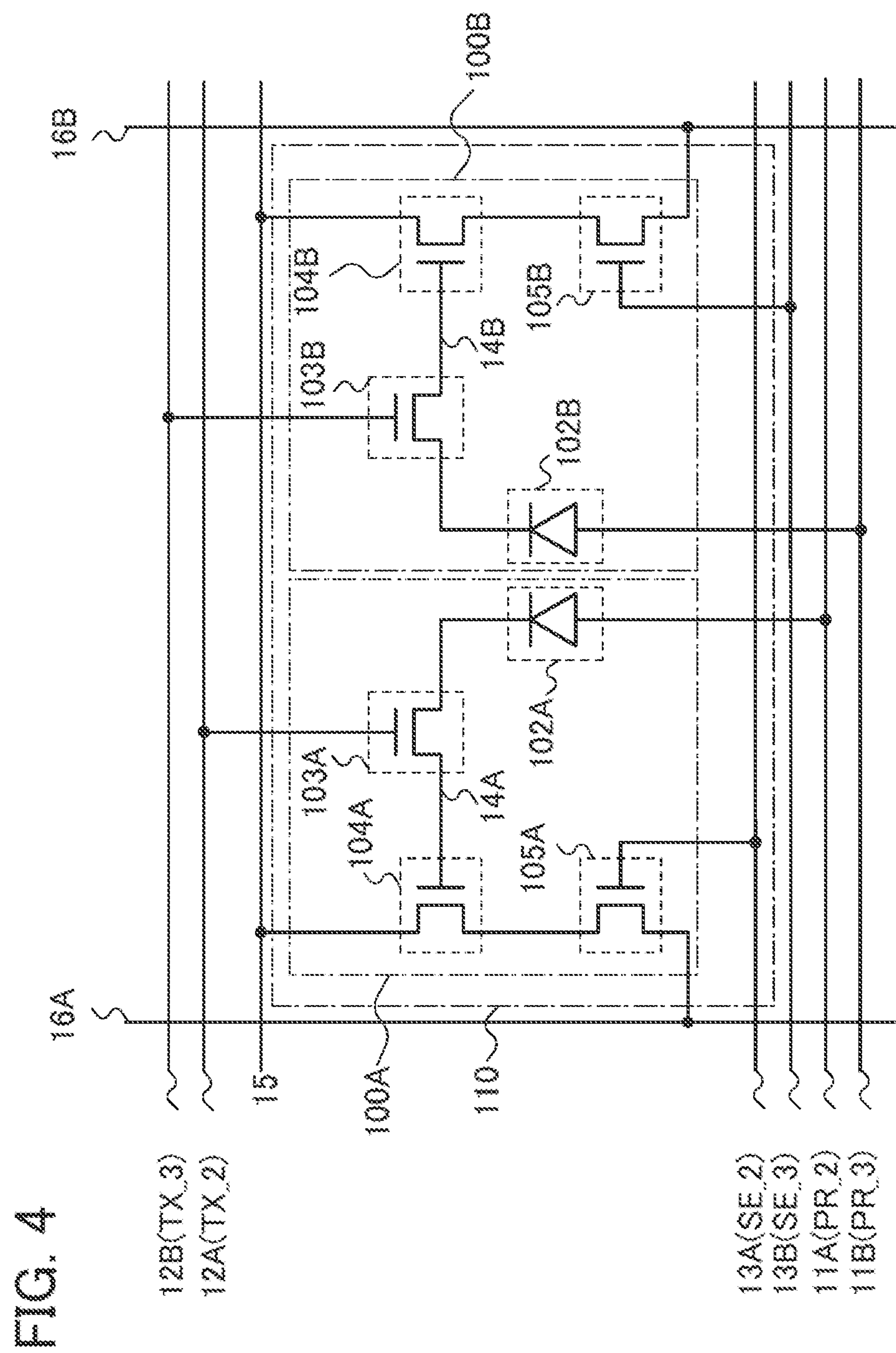
FIG. 4 illustrates an optical sensor.

A structure example of an optical sensor group including one optical sensor 100A and one optical sensor 100B is described with reference to FIG. 4. FIG. 4 is a circuit diagram of an optical sensor group 110. The structure of the optical sensor group 110 including one optical sensor 100A and one optical sensor 100B is not limited to this structure. The optical sensor group 110 may include at least a photodiode that transmits infrared light and absorbs visible light, a photodiode that absorbs infrared light, a transistor that accumulates signal electric charge in an FD node based on the amount of visible light, and a transistor that accumulates signal electric charge in the FD node based on the amount of infrared light.

As illustrated in FIG. 4, the optical sensor group 110 includes two photodiodes and six transistors. Note that in this specification, in particular, in the case of an optical sensor that absorbs visible light and transmits infrared light, components are referred to as, for example, the optical sensor 100A, the photodiode 102A, a transistor 103A, a transistor 104A, and a transistor 105A, and in the case of an optical sensor that absorbs infrared light, components are referred to as, for example, the optical sensor 100B, the photodiode 102B, a transistor 103B, a transistor 104B, and a transistor 105B.

The optical sensor 100A and the optical sensor 100B in FIG. 4 each include three transistors and one photodiode. A reduction in the number of elements in the optical sensor 100A and the optical sensor 100B compared to the number of elements in a general optical sensor leads to a reduction in pixel size and facilitates downsizing of the semiconductor device.

In FIG. 4, signal lines 11A and 11B, signal lines 12A and 12B, signal lines 13A and 13B, nodes 14A and 14B, the signal line 15, and signal lines 16A and 16B are reset signal lines (PR), electric charge accumulation signal lines (TX), selection signal lines (SE), floating diffusion (FD) nodes, an optical sensor reference signal line, and optical sensor output signal lines, respectively. Note that in FIG. 4, signal lines used in 2D imaging are marked with "_2", and signal lines used in 3D imaging are marked with "_3".

The photodiodes 102A and 102B each function as a photoelectric conversion element detecting light entering the diode and generating electric charge. The amount of electric charge to be generated depends on the amount of irradiation light.

The transistors 103A and 103B each function as a transistor controlling imaging. In other words, the transistors 103A and 103B function as transistors controlling the amount of electric charge to be accumulated in the nodes 14A and 14B based on the amount of light delivered to the photodiodes 102A and 102B.

As illustrated in FIG. 4, in the optical sensor group 110, anodes of the photodiodes 102A and 102B are electrically connected to the signal lines 11A and 11B, respectively. Cathodes of the photodiodes 102A and 102B are electrically connected to one of a source electrode and a drain electrode of the transistor 103A and one of a source electrode and a drain electrode of the transistor 103B, respectively. The other of the source electrode and the drain electrode of the transistor 103A and the other of the source electrode and the drain electrode of the transistor 103B are electrically connected to gate electrodes of the transistors 104A and 104B and the nodes 14A and 14B, respectively. One of a source electrode and a drain electrode of the transistor 104A and one of a source electrode and a drain electrode of the transistor 104B are electrically connected to the signal line 15. One of a source electrode and a drain electrode of the transistor 105A and one of a source electrode and a drain electrode of the transistor 105B are electrically connected to the signal lines 16A and 16B, respectively. The other of the source electrode and the drain electrode of the transistor 104A and the other of the source electrode and the drain electrode of the transistor 104B are electrically connected to the other of the source electrode and the drain electrode of the transistor 105A and the other of the source electrode and the drain electrode of the transistor 105B, respectively. Gate electrodes of the transistors 103A and 103B are electrically connected to the signal lines 12A and 12B, respectively. Gate electrodes of the transistors 105A and 105B are electrically connected to the signal lines 13A and 13B, respectively.

<Mechanism for Imaging>

Here, a mechanism for imaging is described. The optical sensor 100 is described below as an example, and similar mechanisms are applied to the optical sensor 100A and the optical sensor 100B. By changing the potential of the anode of the photodiode 102 from "L" into "H" and changing the potential of the gate electrode of the transistor 103 from "L" into "H", positive electric charge is accumulated in the node 14. By changing the potential of the signal line 11 from "H" into "L" in this state, negative electric charge is accumulated in the node 14 (imaging starts) based on the amount of light delivered to the photodiode 102. Next, by changing the potential of the gate electrode of the transistor 103 from "H" into "L", accumulation of electric charge in the node 14 stops (imaging terminates). By switching the potential of the gate electrode of the transistor 103, the amount of electric charge accumulated in the node 14 can be controlled.

Amorphous silicon, microcrystalline silicon, or an oxide semiconductor is preferably used for a semiconductor layer of the transistor 103. A transistor including an oxide semiconductor in a semiconductor layer has extremely low off-state current; thus, electric charge generated by light irradiation of the photodiode 102 can be held for a long time. Consequently, imaging data can be retained for a long time, so that accurate imaging data is easily acquired.

Further, by using an oxide semiconductor material for the semiconductor layer of the transistor 103, the flow of electric charge leaking from the node 14 to the photodiode 102 can be suppressed. In particular, in the case where electric charge is accumulated in the node 14 for a long time, the influence of leakage electric charge is increased; thus, it is particularly preferable to use an oxide semiconductor. By using an oxide semiconductor for the semiconductor layer, detecting the delay period with higher accuracy, and acquiring a highly reliable detection signal, the performance of the entire optical sensor 100 can be increased.

The transistor 104 functions as a transistor that amplifies a potential converted based on the amount of electric charge accumulated in the node 14. An increase in amplification degree of the transistor 104 leads to an increase in sensitivity of the optical sensor 100.

A material such as polycrystalline silicon or single crystal silicon is preferably used for a semiconductor layer of the transistor 104. By using such a material for the semiconductor layer, the amplification degree of electric charge in the node 14 can be increased. Thus, an amplifier transistor having higher sensitivity can be constituted.

The transistor 105 functions as a transistor controlling output of the optical sensor 100. In other words, by switching the potential of the gate electrode, a potential amplified by the transistor 104 can be output as the potential of the signal line 16.

A material such as polycrystalline silicon or single crystal silicon is preferably used for a semiconductor layer of the transistor 105. By using such a material, the on-state current of the transistor 105 can be increased. Thus, a detection signal output period is shortened, so that output from the optical sensor 100 can be controlled at high speed. By using such a material for the semiconductor layer, the switching speed of the signal line 16 can be controlled in a wider range. When a speed difference is accurately extracted by increasing the freedom of speed of potential change, more accurate data can be acquired.

As described above, the optical sensor 100 includes four elements: one photodiode and three transistors. Since the optical sensor can include fewer elements, high integration of the optical sensor and a reduction in pixel size can be facilitated. When a layered structure is constituted by using a material such as polycrystalline silicon or single crystal silicon for the semiconductor layers of the transistors 104 and 105 and using amorphous silicon, microcrystalline silicon, or an oxide semiconductor material for the semiconductor layer of the transistor 103, a more reduction in pixel size can be achieved.

When a high priority is put to reducing the time needed for accumulating electric charge generated by light irradiation of the photodiode 102 in the node 14, that is, when an object moves fast, for example, the semiconductor layer of the transistor 103 can be formed using a material such as amorphous silicon, polycrystalline silicon, or single crystal silicon. Electric charge is accumulated in the node 14 for a short time even when such a material is used, so that an adverse effect due to leakage electric charge can be suppressed.

When the emphasis is put on the operation speed of the medium or small optical sensor 100, all the transistors included in the pixel (the transistors 103, 104, and 105) can be formed using a material such as polycrystalline silicon or single crystal silicon.

When the emphasis is put on cost, size, and performance, all the transistors included in the pixel (the transistors 103, 104, and 105) can be formed using an oxide semiconductor material.

When the emphasis is put on cost and size, all the transistors included in the pixel (the transistors 103, 104, and 105) can be formed using amorphous silicon or microcrystalline silicon.

<Method 1 for Driving Semiconductor Device>

An example of a method for driving a semiconductor device including the optical sensor 100 in FIG. 2 is described below. By employing the driving method, two different detection signals are acquired, so that a distance between the semiconductor device and an object can be calculated.

The distance is calculated by the signal processing circuit included in the semiconductor device. The signal processing circuit can perform appropriate arithmetic processing based on the acquired different detection signals. Thus, a distance between one optical sensor and a certain point of the object can be calculated by performing and stopping irradiation of the object with infrared light from the light source more than once.

Further, by making a period from a time at which infrared light irradiation starts until a time at which the infrared light irradiation stops extremely short and performing and stopping the infrared light irradiation more than once, the semiconductor device can acquire the distance between the object and the optical sensor with high accuracy.

First, a timing chart is described.

Figure 5:
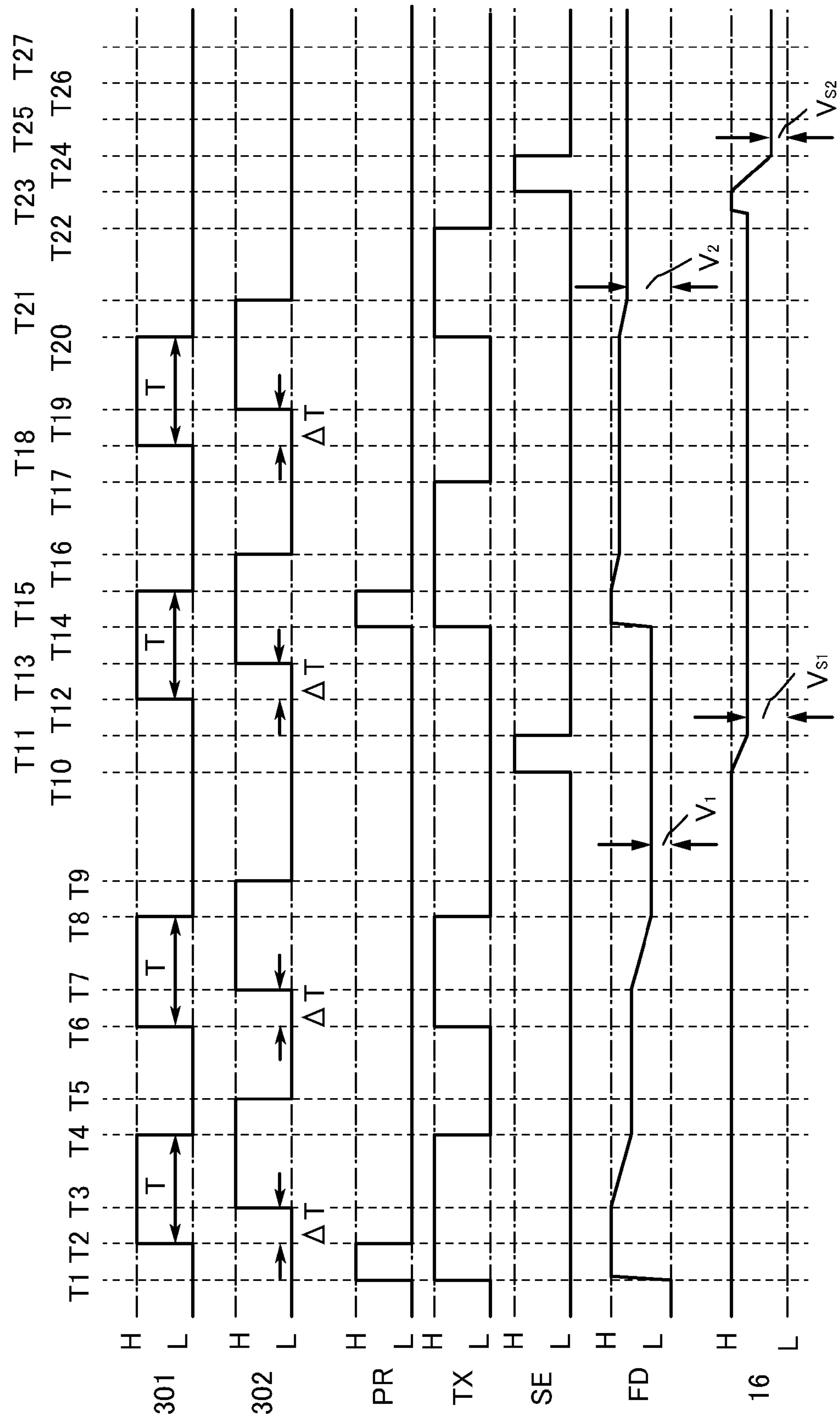
FIG. 5 is a timing chart of an optical sensor.

FIG. 5 illustrates a pulse 301 that indicates timing at which an object is irradiated with infrared light from a light source, a pulse 302 that indicates timing at which light that arrives at the object and is reflected enters a photodiode, a pulse (PR) of the signal line 11, a pulse (TX) of the signal line 12, a pulse (SE) of the signal line 13, a pulse (FD) of the node 14, and a pulse of the signal line 16.

In the pulse 301 in this specification, a period during which infrared light irradiation is performed is denoted by "H", and a period during which infrared light irradiation is not performed is denoted by "L".

As illustrated in FIG. 5, infrared light irradiation in the period T is performed more than once. Note that first infrared light irradiation is performed from a time T2 to a time T4; second infrared light irradiation is performed from a time T6 to a time T8; third infrared light irradiation is performed from a time T12 to a time T15; fourth infrared light irradiation is performed from a time T18 to a time T20; and the period T is extremely short.

In the pulse 302 in this specification, a period during which infrared light that is delivered from the light source to the object is reflected off the object and enters the optical sensor 100 is denoted by "H", and a period during which the infrared light does not enter the optical sensor 100 is denoted by "L".

In the pulse (PR) of the signal line 11, a period during which a potential supplied to the anode of the photodiode 102 is a high potential is denoted by "H", and a period during which the potential supplied to the anode of the photodiode 102 is a low potential is denoted by "L". Note that the same applies to a signal line 11_(*k*−1) (PR_(k−1)) and a signal line 11_(*k*) (PR_(*k*)) in FIG. 7 and a signal line 11A(PR_2) and a signal line 11B(PR_3) in FIG. 8 to be described later.

In the pulse (TX) of the signal line 12 in this specification, a period during which a potential supplied to the gate electrode of the transistor 103 is a high potential is denoted by "H", and a period during which the potential supplied to the gate electrode of the transistor 103 is a low potential is denoted by "L". Note that the same applies to a signal line 12_(*k*−1) (TX_(*k*−1)) and a signal line 12_(*k*) (TX_(*k*)) in FIG. 7 and a signal line 12A(TX_2) and a signal line 12B (TX_3) in FIG. 8 to be described later.

In the pulse (SE) of the signal line 13 in this specification, a period during which a potential supplied to the gate electrode of the transistor 105 is a high potential is denoted by "H", and a period during which the potential supplied to the gate electrode of the transistor 105 is a low potential is denoted by "L". Note that the same applies to a signal line 13_(*k*−1) (SE_(*k*−1)) and a signal line 13_(*k*) (SE_(*k*)) in FIG. 7 and a signal line 13A(SE_2) and a signal line 13B(SE_3) in FIG. 8 to be described later.

In the pulse (FD) of the node 14 in FIG. 5, a high potential period is denoted by "H"; a low potential period is denoted by "L"; a potential difference between the low potential "L" and the node 14 at a time T9 is denoted by "$V_1$"; and a potential difference between the low potential "L" and the node 14 at a time T21 is denoted by "$V_2$".

In the pulse of the signal line 16 in FIG. 5, a high potential period is denoted by "H"; a low potential period is denoted by "L"; a potential difference between the low potential "L" and the signal line 16 at a time T11 is denoted by "$V_{S1}$"; and a potential difference between the low potential "L" and the signal line 16 at a time T24 is denoted by "$V_{S2}$".

Note that in FIG. 5, the potential difference "$V_{S1}$" between the low potential "L" and the signal line 16 at the time T11 corresponds to a first detection signal $S_1$, and the potential difference "$V_{S2}$" between the low potential "L" and the signal line 16 at the time T24 corresponds to a second detection signal $S_2$.

In FIG. 5, the delay period ΔT corresponds to a period from the time T2 to the time T3, a period from the time T6 to the time T7, a period from the time T12 to the time T13, and a period from the time T18 to the time T19.

Note that in this specification, the low potential "L" is a common potential.

Note that in FIG. 5, the period T is fixed in four infrared light irradiations.

In a period during which the imaging is performed, a distance between the semiconductor device and the object is not changed. Thus, it can be assumed that the delay period ΔT is fixed in the four infrared light irradiations.

In FIG. 5 infrared light irradiation for acquiring the first detection signal is performed twice and infrared light irradiation for acquiring the second detection signal is performed twice; however, it is also effective to perform each infrared light irradiation three times or more, and the number of times is not particularly limited. Note that the number of infrared light irradiations for acquiring the first detection signal is equal to the number of infrared light irradiations for acquiring the second detection signal.

Next, a method for calculating a distance between one optical sensor in a semiconductor device and a certain point of an object is described. The case where infrared light irradiation is performed twice is described with reference to the timing chart in FIG. 5. Assuming that a distance between the semiconductor device and the object is denoted by x, detection signal intensity is proportional to net exposure time (reflected light incident time in an imaging period), a proportional constant is denoted by α (α is fixed), a first detection signal is denoted by $S_1(\mathbf{2})$, a second detection signal is denoted by $S_2(\mathbf{2})$, and light speed is denoted by c ($3\times10^8$ m/s), the first detection signal $S_1(\mathbf{2})$, the second detection signal $S_2(\mathbf{2})$, the delay period ΔT, and the distance x can be expressed as follows.

$$S_1(2) = \alpha\times((T4-T2)-(T3-T2))+\alpha\times((T8-T6)-(T7-T6)) = 2\alpha(T-\Delta T)$$

$$S_2(2) = \alpha\times(T13-T12)+\alpha\times(T19-T18) = 2\alpha\Delta T$$

$$\Delta T = \frac{S_2(2)\times T}{S_1(2)+S_2(2)}$$

$$x = \frac{c\times\Delta T}{2} = \frac{c\times T\times S_2(2)}{2(S_1(2)+S_2(2))}$$

From analogical reasoning of the case where infrared light irradiation is performed twice, the case where infrared light irradiation is performed n times can be easily formulated as follows. Assuming that a distance between the semiconductor device and the object is denoted by x, detection signal intensity is proportional to net exposure time (reflected light incident time in an imaging period), a proportional constant is denoted by α (α is fixed), a first detection signal is denoted by $S_1(n)$, a second detection signal is denoted by $S_2(n)$, and light speed is denoted by c ($3\times10^8$ m/s), the first detection signal $S_1(n)$, the second detection signal $S_2(n)$, the delay period ΔT, and the distance x can be expressed as follows.

$$S_1(n) = n\times\alpha\times(T-\Delta T) \tag{A}$$

$$S_2(n) = n\times\alpha\times(\Delta T)$$

$$\Delta T = \frac{S_2(n)\times T}{S_1(n)+S_2(n)}$$

$$x = \frac{c\times\Delta T}{2} = \frac{c\times T\times S_2(n)}{2(S_1(n)+S_2(n))}$$

The calculation shows that even when the number of infrared light irradiations is varied, the distance x does not depend on the delay period ΔT and can be calculated from the irradiation period, the detection signals, and the light speed.

The accuracy of the first detection signal $S_1(n)$ and the second detection signal $S_2(n)$ is increased as the number of infrared light irradiations n is increased. As the number of infrared light irradiations is increased, a change in potential of the FD node and a change in potential of an output signal line are increased, and a change in detection signal intensity is increased; thus, an S/N ratio can be improved. Consequently, as the number of infrared light irradiations is increased, a higher-precision distance x can be calculated.

The infrared light irradiation period T is preferably short but is longer than the delay period ΔT. As the period T becomes shorter, the ratio of the delay period ΔT in the period T can be increased. By increasing changes in the first detection signal $S_1$ and the second detection signal $S_2$ with respect to the distance x, sensitivity to the distance x is easily increased, so that accuracy can be improved.

In other words, compared to the case where one infrared light irradiation is performed for a long period, by performing infrared light irradiation for the extremely short period T more than once every time a detection signal is acquired, a distance between the semiconductor device and the object can be calculated with high accuracy, and the entire measurement time can be markedly shortened.

Next, a specific method for driving a semiconductor device is described with reference to the timing chart in FIG. 5.

At a time T1, the potential of the signal line 11 is changed from "L" into "H" (first reset operation). In addition, the potential of the signal line 12 is changed from "L" into "H". At this time, the photodiode 102 and the transistor 103 are brought into conduction, and the potential of the node 14 is set to "H".

At the time T2, first infrared light irradiation in which the object is irradiated with infrared light from the light source starts. The pulse 301 is changed from "L" into "H". Further, the potential of the signal line 11 is changed from "H" into "L". The potential of the signal line 12 is held to "H".

At the time T3, imaging in accordance with the first infrared light irradiation starts. At the time T3, light reflected from the object in the first infrared light irradiation starts to enter the photodiode 102. Note that the reflected light is infrared light. The pulse 302 is changed from "L" into "H". The potential of the node 14 starts to decrease from "H". The signal line 12 is held to "H".

At the time T4, the first infrared light irradiation stops (a period from the time T2 to the time T4 is the period T).

The pulse 301 is changed from "H" into "L". In addition, the potential of the signal line 12 is changed from "H" into "L". The imaging in accordance with the first infrared light irradiation terminates. Further, at the time T4, a decrease in potential of the node 14 stops, and the potential of the node 14 is fixed.

The potential of the node 14 at the time T4 depends on the amount of light delivered to the photodiode 102 in a period from the time T3 to the time T4 (in the first infrared light irradiation). As the amount of light is large, a change in potential is increased. In other words, at the same length of irradiation period, a change in potential is increased as light intensity is increased, and at the same light intensity, a change in potential is increased as the irradiation period is long.

When the signal line 12 is set to "L", parasitic capacitance between the signal line 12 and the node 14 causes a change in potential of the node 14. A significant change in potential inhibits accurate acquisition of photocurrent generated by the photodiode 102. Thus, effective methods of reducing the influence of parasitic capacitance are, for example, to reduce gate-source capacitance of the transistor 103 or gate-drain capacitance of the transistor 103 and to connect a storage capacitor to the node 14. The optical sensor in this embodiment employs these methods, so that a change in potential of the node due to parasitic capacitance can be negligible.

At a time T5, entry of light reflected from an object into the photodiode 102 terminates. The pulse 302 is changed from "H" into "L".

At the time T6, second infrared light irradiation in which the object is irradiated with infrared light from the light source starts. The pulse 301 is changed from "L" into "H". Further, the potential of the signal line 12 is changed from "L" into "H". The potential of the node 14 is held to the potential at the time T4.

At the time T7, imaging in accordance with the second infrared light irradiation starts. At the time T7, light reflected from the object in the second infrared light irradiation starts to enter the photodiode 102. The pulse 302 is changed from "L" into "H". The potential of the node 14 starts to decrease from the potential at the time T4. The signal line 12 is held to "H".

At the time T8, the second infrared light irradiation stops (a period from the time T6 to the time T8 is the period T).

The pulse 301 is changed from "H" into "L". In addition, the potential of the signal line 12 is changed from "H" into "L". The imaging in accordance with the second infrared light irradiation terminates. Further, at the time T8, a decrease in potential of the node 14 stops, and the potential of the node 14 is fixed. The potential of the node 14 at the time T8 is denoted by "$V_1$".

The potential "$V_1$" of the node 14 at the time T8 depends on the sum of the amount of light delivered to the photodiode 102 in the period from the time T3 to the time T4 and the amount of light delivered to the photodiode 102 in a period from the time T7 to the time T8 (in the second infrared light irradiation).

At the time T9, entry of light reflected from the object into the photodiode 102 terminates. The pulse 302 is changed from "H" into "L".

At a time T10, the potential of the signal line 13 is changed from "L" into "H" (first reading starts). A potential "H" is supplied to the gate electrode, so that the transistor 105 is turned on. Further, the signal line 15 and the signal line 16 are brought into conduction through the transistor 104 and the transistor 105.

The potential of the signal line 16 starts to decrease from "H".

Note that the signal line 16 is precharged before the time T10 so that the potential of the signal line 16 is set to "H".

At the time T11, the potential of the signal line 13 is changed from "H" into "L" (the first reading terminates). The transistor 105 is turned off, a decrease in potential of the signal line 16 stops, and the potential of the signal line 16 is fixed. The potential of the signal line 16 at the time T11 is denoted by "$V_{S1}$".

By acquiring the potential "$V_{S1}$" of the signal line 16 at the time T11, the sum of the amount of light delivered to the photodiode 102 in the first infrared light irradiation and the amount of light delivered to the photodiode 102 in the second infrared light irradiation can be detected.

When the amount of light delivered to the photodiode 102 is large, the amount of change in potential of the node 14 during a certain period is large; thus, the potential of the node 14 decreases. Further, the channel resistance of the transistor 104 increases, so that the speed at which the potential of the signal line 16 decreases becomes low. Consequently, the amount of change in potential of the node 14 and the amount of change in potential of the signal line 16 are inverted.

Note that when the light intensity during the first infrared light irradiation and the second infrared light irradiation is fixed, the potential "$V_{S1}$" of the signal line 16 is proportional to the irradiation period.

At the time T12, third infrared light irradiation in which the object is irradiated with infrared light from the light source starts. The pulse 301 is changed from "L" into "H".

At the time T13, light reflected from the object in the third infrared light irradiation starts to enter the photodiode 102. The pulse 302 is changed from "L" into "H".

At a time T14, the potential of the signal line 11 is changed from "L" into "H" (second reset operation). In addition, the potential of the signal line 12 is changed from "L" into "H". At this time, the photodiode 102 and the transistor 103 are brought into conduction, and the potential of the node 14 is set to "H".

Note that the second reset operation may be performed before the third infrared light irradiation.

At the time T15, imaging in accordance with the third infrared light irradiation starts. At the time T15, the third infrared light irradiation stops (a period from the time T12 to the time T15 is the period T). The pulse 301 is changed from "H" into "L". The potential of the signal line 11 is changed from "H" into "L". The potential of the node 14 starts to decrease from "H". The signal line 12 is held to "H".

At a time T16, entry of light reflected from the object into the photodiode 102 terminates. The pulse 302 is changed from "H" into "L". The signal line 12 is held to the potential "H".

The imaging in accordance with the third infrared light irradiation terminates. Further, at the time T16, a decrease in potential of the node 14 stops, and the potential of the node 14 is fixed.

The potential of the node 14 at the time T16 depends on the amount of light delivered to the photodiode 102 in a period from the time T15 to the time T16 (after the third infrared light irradiation).

At a time T17, the potential of the signal line 12 is changed from "H" into "L".

Note that the photodiode 102 is not irradiated with reflected light in a period from the time T16 to the time T17.

At the time T18, fourth infrared light irradiation in which the object is irradiated with infrared light from the light source starts. The pulse 301 is changed from "L" into "H".

At the time T19, light reflected from the object in the fourth infrared light irradiation starts to enter the photodiode 102. The pulse 302 is changed from "L" into "H".

At the time T20, imaging in accordance with the fourth infrared light irradiation starts. At the time T20, the fourth infrared light irradiation stops (a period from the time T18 to the time T20 is the period T). The pulse 301 is changed from "H" into "L". The potential of the signal line 12 is changed from "L" into "H". At the time T20, the potential of the node 14 starts to decrease from the potential at the time T16.

At the time T21, entry of light reflected from the object into the photodiode 102 terminates. The pulse 302 is changed from "H" into "L". The signal line 12 is held to the potential "H".

At the time T21, the imaging in accordance with the fourth infrared light irradiation terminates. Further, at the time T21, a decrease in potential of the node 14 stops, and the potential of the node 14 is fixed. The potential of the node 14 at the time T21 is denoted by "$V_2$".

The potential "$V_2$" of the node 14 at the time T21 depends on the sum of the amount of light delivered to the photodiode 102 in the period from the time T15 to the time T16 and the amount of light delivered to the photodiode 102 in a period from the time T20 to the time T21.

At a time T22, the potential of the signal line 12 is changed from "H" into "L".

At a time T23, the potential of the signal line 13 is changed from "L" into "H" (second reading starts). A potential "H" is supplied to the gate electrode, so that the transistor 105 is turned on. Further, the signal line 15 and the signal line 16 are brought into conduction through the transistor 104 and the transistor 105.

The potential of the signal line 16 starts to decrease from "H".

Note that the signal line 16 is precharged before the time T23 so that the potential of the signal line 16 is set to "H".

Figure 6:
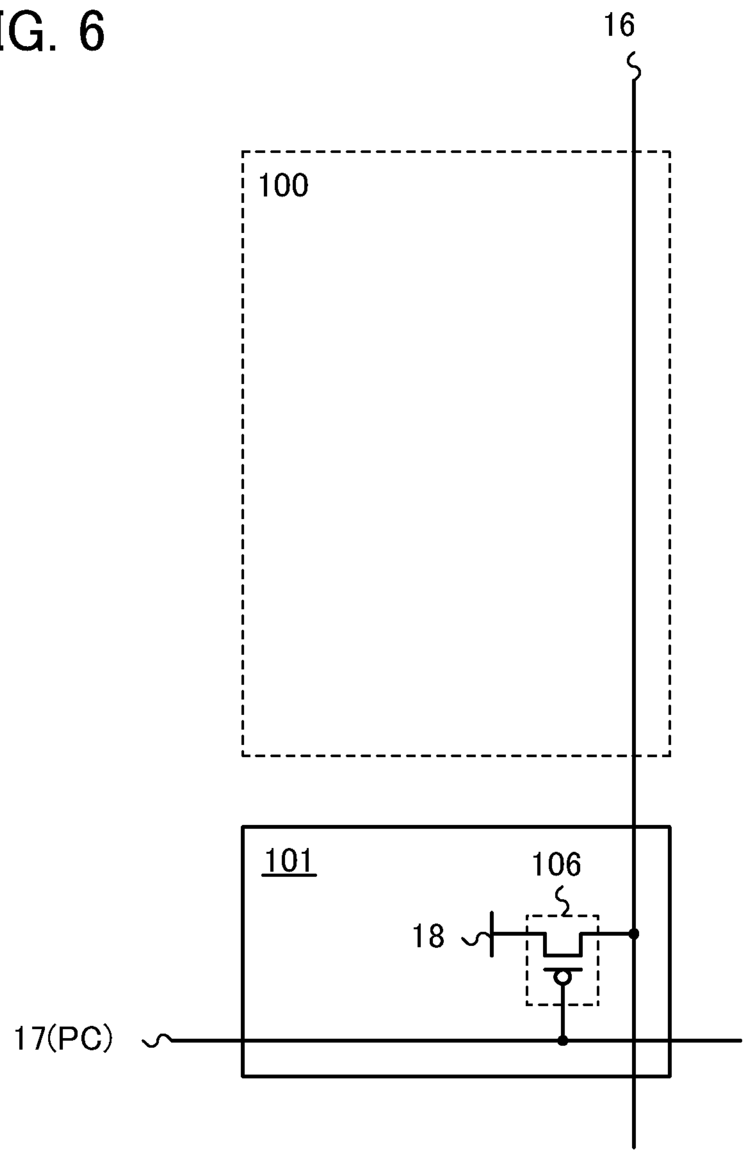
FIG. 6 illustrates a read circuit.

There is no limitation on the structure of a read circuit with which the signal line 16 is precharged. As illustrated in FIG. 6, a read circuit 101 can include one p-channel transistor 106. A signal line 17 is a precharge signal line. A node 18 is a high potential supply line. A gate electrode of the transistor 106 is electrically connected to the signal line 17. One of a source electrode and a drain electrode of the transistor 106 is electrically connected to the signal line 16. The other of the source electrode and the drain electrode of the transistor 106 is electrically connected to the node 18.

At the time T24, the potential of the signal line 13 is changed from "H" into "L" (the second reading terminates). The transistor 105 is turned off, a decrease in potential of the signal line 16 stops, and the potential of the signal line 16 is fixed. The potential of the signal line 16 at the time T24 is denoted by "$V_{S2}$".

By acquiring the potential "$V_{S2}$" of the signal line 16 at the time T24, the sum of the amount of light delivered to the photodiode 102 after the third infrared light irradiation and the amount of light delivered to the photodiode 102 after the fourth infrared light irradiation can be detected.

Note that when the light intensity during the third infrared light irradiation and the fourth infrared light irradiation is fixed, the potential "$V_{S2}$" of the signal line 16 is proportional to the irradiation period.

Note that in this embodiment, the imaging periods in accordance with the third and fourth infrared light irradiations (the period from the time T15 to the time T16 and the period from the time T20 to the time T21) are shorter than the imaging periods in accordance with the first and second infrared light irradiations (the period from the time T3 to the time T4 and the period from the time T7 to the time T8). Thus, the potential "$V_{S2}$" of the signal line 16 at the time T24 is lower than the potential "$V_{S1}$" of the signal line 16 at the time T11.

At a time T25, the optical sensor 100 can acquire the first detection signal $S_1$ and the second detection signal $S_2$.

By applying the above driving method to a plurality of pixels included in a semiconductor device, a distance between each optical sensor and an object can be calculated with higher accuracy.

<Method 2 for Driving Semiconductor Device>

An example of a method for driving a semiconductor device including the optical sensor in FIG. 3 is described with reference to FIG. 7.

Figure 7:
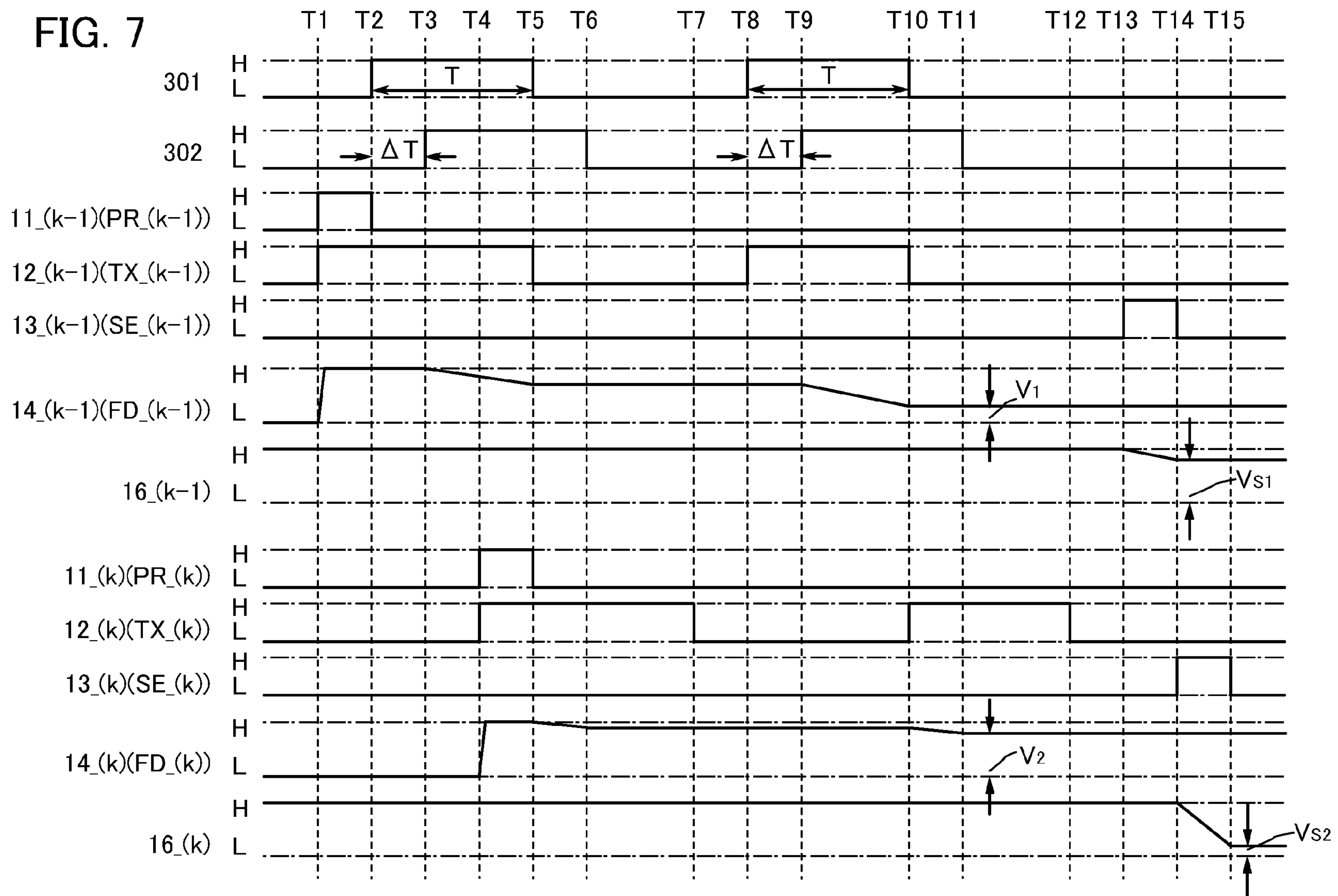
FIG. 7 is a timing chart of an optical sensor.

As illustrated in FIG. 7, infrared light irradiation in the period T is performed more than once. Note that first infrared light irradiation is performed from the time T2 to the time T5; second infrared light irradiation is performed from the time T8 to the time T10; and the period T is extremely short.

In the pulse (FD) of the node 14 in FIG. 7, a high potential period is denoted by "H"; a low potential period is denoted by "L"; a potential difference between the low potential "L" and a node 14_(*k*−1) at the time T10 is denoted by "$V_1$"; and a potential difference between the low potential "L" and a node 14_(*k*) at the time T11 is denoted by "$V_2$".

In the pulse of the signal line 16 in FIG. 7, a high potential period is denoted by "H"; a low potential period is denoted by "L"; a potential difference between the low potential "L" and a signal line 16_(*k*−1) at the time T14 is denoted by "$V_{S1}$"; and a potential difference between the low potential "L" and a signal line 16_(*k*) at the time T15 is denoted by "$V_{S2}$".

Note that in FIG. 7, the potential difference "$V_{S1}$" between the low potential "L" and the signal line 16_(*k*−1) at the time T14 corresponds to the first detection signal $S_1$, and the potential difference "$V_{S2}$" between the low potential "L" and the signal line 16_(*k*) at the time T15 corresponds to the second detection signal $S_2$.

In FIG. 7, the delay period ΔT corresponds to a period from the time T2 to the time T3 and a period from the time T8 to the time T9.

Note that in FIG. 7, the period T is fixed in two infrared light irradiations.

Note that in a period during which the imaging is performed, a distance between the light source and the object is changed. It can be assumed that the delay period ΔT is substantially fixed in the two infrared light irradiations.

In FIG. 7, infrared light irradiation for acquiring the first detection signal and the second detection signal is performed twice; however, it is also effective to perform the infrared light irradiation three times or more, and the number of times is not particularly limited.

Next, a method for calculating a distance between one optical sensor in a semiconductor device and a certain point of an object is described. The case where infrared light irradiation is performed twice is described with reference to the timing chart in FIG. 7. Assuming that a distance between the light source and the object is denoted by x, detection signal intensity is proportional to net exposure time (reflected light incident time in an imaging period), a proportional constant is denoted by α (α is fixed), a first detection signal is denoted by $S_1$(2), a second detection signal is denoted by $S_2$(2), and light speed is denoted by c ($3\times10^8$ m/s), the first detection signal $S_1$(2), the second detection signal $S_2$(2), the delay period ΔT, and the distance x can be expressed as follows.

$$S_1(2) = \alpha\times((T5-T2)-(T3-T2)) + \alpha\times((T10-T8)-(T9-T8)) = 2\alpha(T-\Delta T)$$

$$S_2(2) = \alpha\times(T3-T2) + \alpha\times(T9-T8) = 2\alpha\Delta T$$

$$\Delta T = \frac{S_2(2)\times T}{S_1(2)+S_2(2)}$$

$$x = \frac{c\times\Delta T}{2} = \frac{c\times T\times S_2(2)}{2(S_1(2)+S_2(2))}$$

From analogical reasoning of the case where infrared light irradiation is performed twice, the case where infrared light irradiation is performed n times can be easily formulated. Since the details are similar to those of the method 1 for driving a semiconductor device, a description thereof is omitted.

Next, a specific method for driving a semiconductor device is described with reference to the timing chart in FIG. 7.

At the time T1, the potential of the signal line 11_(*k*−1) is changed from "L" into "H" (reset operation). In addition, the potential of the signal line 12_(*k*−1) is changed from "L" into "H". At this time, a photodiode 102_(*k*−1) and a transistor 103_(*k*−1) are brought into conduction, and the potential of the node 14_(*k*−1) is set to "H".

At the time T2, first infrared light irradiation in which the object is irradiated with infrared light from the light source starts. The pulse 301 is changed from "L" into "H". Further, the potential of the signal line 11_(*k*—1) is changed from "H" into "L". The potential of the signal line 12_(*k*−1) is held to "H".

At the time T3, first imaging in accordance with the first infrared light irradiation starts. At the time T3, light reflected from the object in the first infrared light irradiation starts to enter the photodiode 102_(*k*−1). Note that the reflected light is infrared light. The pulse 302 is changed from "L" into "H". The potential of the node 14_(*k*−1) starts to decrease from "H". The signal line 12_(*k*−1) is held to "H".

At the time T4, the potential of the signal line 11_(*k*) is changed from "L" into "H" (reset operation). In addition, the potential of the signal line 12_(*k*) is changed from "L" into "H". At this time, a photodiode 102_(*k*) and a transistor 103_(*k*) are brought into conduction, and the potential of the node 14_(*k*) is set to "H".

At the time T5, the first infrared light irradiation stops (a period from the time T2 to the time T5 is the period T). The pulse 301 is changed from "H" into "L". In addition, the potential of the signal line 12_(*k*−1) is changed from "H" into "L". The first imaging in accordance with the first infrared light irradiation terminates. Further, at the time T5, a decrease in potential of the node 14_(*k*−1) stops, and the potential of the node 14_(*k*−1) is fixed.

At the time T5, second imaging in accordance with the first infrared light irradiation starts. At the time T5, light reflected from the object in the first infrared light irradiation starts to enter the photodiode 102_(*k*). The potential of the signal line 11_(*k*) is changed from "H" into "L". The potential of the signal line 12_(*k*) is held to "H". The potential of the node 14_(*k*) starts to decrease from "H".

The potential of the node 14_(*k*−1) at the time T5 depends on the amount of light delivered to the photodiode 102_(*k*−1) in a period from the time T3 to the time T5 (in the first infrared light irradiation). As the amount of light is large, a change in potential is increased. In other words, at the same length of irradiation period, a change in potential is increased as light intensity is increased, and at the same light intensity, a change in potential is increased as the irradiation period is long.

At the time T6, entry of light reflected from the object into the photodiode 102_(*k*−1) terminates. The second imaging in accordance with the first infrared light irradiation terminates. The pulse 302 is changed from "H" into "L". The potential of the signal line 12_(*k*) is held to "H". Further, a decrease in potential of the node 14_(*k*) stops, and the potential of the node 14_(*k*) is fixed.

At the time T7, the potential of the signal line 12_(*k*) is changed from "H" into "L".

At the time T8, second infrared light irradiation in which the object is irradiated with infrared light from the light source starts. The pulse 301 is changed from "L" into "H". Further, the potential of the signal line 12_(*k*−1) is changed from "L" into "H". The potential of the node 14_(*k*−1) is held to the potential at the time T5.

At the time T9, first imaging in accordance with the second infrared light irradiation starts. At the time T9, light reflected from the object in the second infrared light irradiation starts to enter the photodiode 102_(*k*−1). The pulse 302 is changed from "L" into "H". The potential of the node 14_(*k*−1) starts to decrease from the potential at the time T5. The signal line 12_(*k*−1) is held to "H".

At the time T10, the second infrared light irradiation stops (a period from the time T8 to the time T10 is the period T).

The pulse 301 is changed from "H" into "L". In addition, the potential of the signal line 12_(*k*−1) is changed from "H" into "L". The first imaging in accordance with the second infrared light irradiation terminates. Further, at the time T10, a decrease in potential of the node 14_(*k*−1) stops, and the potential of the node 14_(*k*−1) is fixed. The potential of the node 14_(*k*−1) at the time T10 is denoted by "$V_1$".

The potential "$V_1$" of the node 14_(*k*−1) at the time T10 depends on the sum of the amount of light delivered to the photodiode 102_(*k*−1) in the period from the time T3 to the time T5 and the amount of light delivered to the photodiode 102_(*k*−1) in a period from the time T9 to the time T10.

At the time T10, second imaging in accordance with the second infrared light irradiation starts. The potential of the signal line 12_(*k*) is changed from "L" into "H". At the time T10, light reflected from the object in the second infrared light irradiation starts to enter the photodiode 102_(*k*). The potential of the node 14_(*k*) starts to decrease from the potential at the time T6.

At the time T11, entry of light reflected from the object into the photodiode 102_(*k*) terminates. The second imaging in accordance with the second infrared light irradiation terminates. The pulse 302 is changed from "H" into "L". The potential of the signal line 12_(*k*) is held to "H". Further, a decrease in potential of the node 14_(*k*) stops, and the potential of the node 14_(*k*) is fixed. The potential of the node 14_(*k*) at the time T11 is denoted by "$V_2$".

The potential "$V_2$" of the node 14_(*k*) at the time T11 depends on the sum of the amount of light delivered to the photodiode 102_(*k*) in the period from the time T5 to the time T6 and the amount of light delivered to the photodiode 102_(*k*) in a period from the time T10 to the time T11.

At the time T12, the potential of the signal line 12_(*k*) is changed from "H" into "L".

At the time T13, the potential of the signal line 13_(*k*−1) is changed from "L" into "H" (first reading starts). A potential "H" is supplied to a gate electrode, so that a transistor 105_(*k*−1) is turned on. Further, a signal line 15_(*k*−1) and the signal line 16_(*k*−1) are brought into conduction through a transistor 104_(*k*−1) and the transistor 105_(*k*−1).

The potential of the signal line 16_(*k*−1) starts to decrease from "H".

Note that the signal line 16_(*k*−1) is precharged before the time T13 so that the potential of the signal line 16_(*k*−1) is set to "H".

There is no limitation on the structure of a read circuit with which the signal line 16_(*k*−1) is precharged. For example, the read circuit 101 in FIG. 6 can be used.

At the time T14, the potential of the signal line 13_(*k*−1) is changed from "H" into "L" (the first reading terminates). The transistor 105_(*k*−1) is turned off, a decrease in potential of the signal line 16_(*k*−1) stops, and the potential of the signal line 16_(*k*−1) is fixed. The potential of the signal line 16_(*k*−1) at the time T14 is denoted by "$V_{S1}$".

By acquiring the potential "$V_{S1}$" of the signal line 16_(*k*−1) at the time T14, the sum of the amount of light delivered to the photodiode 102_(*k*−1) in the two infrared light irradiations can be detected.

At the time T14, the potential of the signal line 13_(*k*) is changed from "L" into "H" (second reading starts). A potential "H" is supplied to a gate electrode, so that a transistor 105_(*k*) is turned on. Further, a signal line 15_(*k*) and the signal line 16_(*k*) are brought into conduction through a transistor 104_(*k*) and the transistor 105_(*k*).

The potential of the signal line 16_(*k*) starts to decrease from "H".

Note that the signal line 16_(*k*) is precharged before the time T14 so that the potential of the signal line 16_(*k*) is set to "H".

There is no limitation on the structure of a read circuit with which the signal line 16_(*k*) is precharged.

At the time T15, the potential of the signal line 13_(*k*) is changed from "H" into "L" (the second reading terminates). The transistor 105_(*k*) is turned off, a decrease in potential of the signal line 16_(*k*) stops, and the potential of the signal line 16_(*k*) is fixed. The potential of the signal line 16_(*k*) at the time T15 is denoted by "$V_{S2}$".

By acquiring the potential "$V_{S2}$" of the signal line 16_(*k*) at the time T15, the sum of the amount of light delivered to the photodiode 102_(*k*) after the two infrared light irradiations can be detected.

Note that when the light intensity during the first infrared light irradiation and the second infrared light irradiation is fixed, the potential difference "$V_{S1}$" between the low potential "L" and the signal line 16_(*k*−1) at the time T14 and the potential difference "$V_{S2}$" between the low potential "L" and the signal line 16_(*k*) at the time T15 are proportional to the irradiation period.

Note that in this embodiment, the imaging period in the period from the time T5 to the time T6 (the period from the time T10 to the time T11) is shorter than the imaging period in the period from the time T3 to the time T5 (the period from the time T9 to the time T10). Thus, "$V_{S2}$" is lower than "$V_{S1}$".

At the time T15, the optical sensor can acquire the first detection signal $S_1$ and the second detection signal $S_2$. In the above driving method, infrared light irradiation is performed more than once to acquire the first detection signal $S_1$ and the second detection signal $S_2$, and light reflected from the object in each infrared light irradiation can be detected by adjacent photodiodes with no time difference.

Thus, by applying the above driving method to a plurality of pixels included in a semiconductor device, a distance between each optical sensor and an object can be calculated with higher accuracy even when the object is a moving object.

<Method 3 for Driving Semiconductor Device>

An example of a method for driving a semiconductor device including the optical sensor group 110 in FIG. 4 is described with reference to FIG. 8. By employing the driving method, two different detection signals are acquired, so that a distance between the semiconductor device and an object can be calculated. Further, by overlapping the photodiode 102A with the photodiode 102B, range information and image information can be acquired concurrently.

The distance is calculated by the signal processing circuit included in the semiconductor device. The signal processing circuit can perform appropriate arithmetic processing based on the acquired different detection signals. Thus, a distance between one optical sensor absorbing infrared light and a certain point of the object can be calculated by performing and stopping irradiation of the object with infrared light from the light source more than once.

Further, by making a period from a time at which infrared light irradiation starts until a time at which the infrared light irradiation stops extremely short and performing and stopping the infrared light irradiation more than once, the semiconductor device can acquire the distance between the object and the optical sensor absorbing infrared light with high accuracy.

Figure 8:
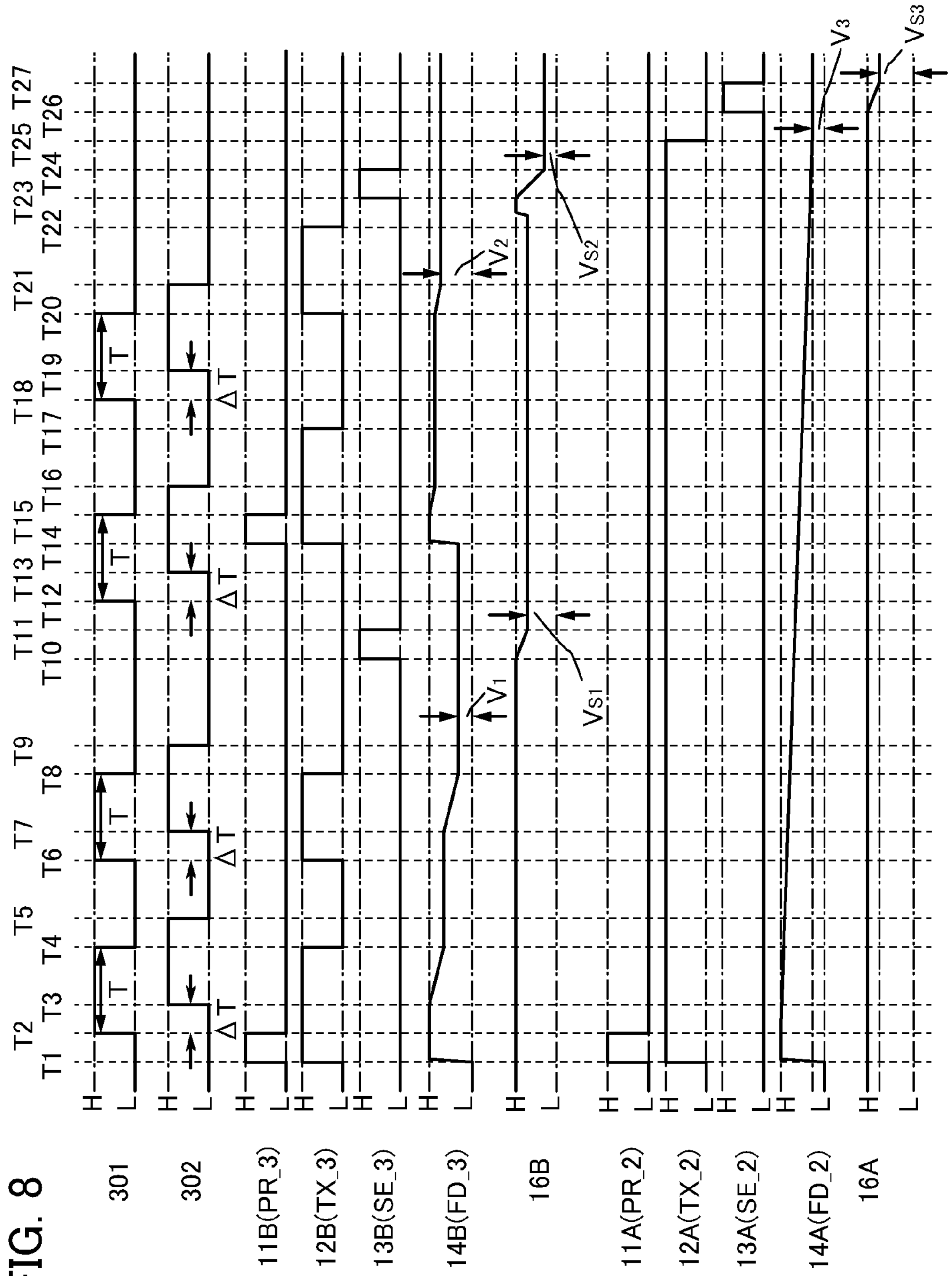
FIG. 8 is a timing chart of an optical sensor.

As illustrated in FIG. 8, infrared light irradiation in the period T is performed more than once. Note that first infrared light irradiation is performed from the time T2 to the time T4; second infrared light irradiation is performed from the time T6 to the time T8; third infrared light irradiation is performed from the time T12 to the time T15; fourth infrared light irradiation is performed from the time T18 to the time T20; and the period T is extremely short.

In a pulse (FD_2) of the node 14A, a high potential period is denoted by "H"; a low potential period is denoted by "L"; and a potential difference between the low potential "L" and the node 14A at the time T25 is denoted by "$V_3$".

In a pulse (FD_3) of the node 14B, a high potential period is denoted by "H"; a low potential period is denoted by "L"; a potential difference between the low potential "L" and the node 14B at the time T9 is denoted by "$V_1$"; and a potential difference between the low potential "L" and the node 14B at the time T21 is denoted by "$V_2$".

In the pulse of the signal line 16A, a high potential period is denoted by "H"; a low potential period is denoted by "L"; and a potential difference between the low potential "L" and the signal line 16A at a time T27 is denoted by "$V_{S3}$".

In the pulse of the signal line 16B, a high potential period is denoted by "H"; a low potential period is denoted by "L"; a potential difference between the low potential "L" and the signal line 16B at the time T11 is denoted by "$V_{S1}$"; and a potential difference between the low potential "L" and the signal line 16B at the time T24 is denoted by "$V_{S2}$".

Note that the potential difference "$V_{S1}$" between the low potential "L" and the signal line 16B at the time T11 corresponds to the first detection signal $S_1$; the potential difference "$V_{S2}$" between the low potential "L" and the signal line 16B at the time T24 corresponds to the second detection signal $S_2$; and the potential difference "$V_{S3}$" between the low potential "L" and the signal line 16A at the time T27 corresponds to a third detection signal $S_3$.

In FIG. 8, the delay period ΔT corresponds to a period from the time T2 to the time T3, a period from the time T6 to the time T7, a period from the time T12 to the time T13, and a period from the time T18 to the time T19.

Note that in FIG. 8, the period T is fixed in four infrared light irradiations.

In a period during which the imaging is performed, a distance between the light source and the object is not changed. Thus, it can be assumed that the delay period ΔT is fixed in the four infrared light irradiations.

Note that in FIG. 8, infrared light irradiation for acquiring the first detection signal is performed twice and infrared light irradiation for acquiring the second detection signal is performed twice; however, it is also effective to perform each infrared light irradiation three times or more, and the number of times is not particularly limited. Note that the number of infrared light irradiations for acquiring the first detection signal is equal to the number of infrared light irradiations for acquiring the second detection signal.

A method for calculating a distance between one optical sensor absorbing infrared light in a semiconductor device and a certain point of an object is similar to that of the method 1 for driving a semiconductor device; thus, a description thereof is omitted.

Next, a specific method for driving a semiconductor device is described with reference to the timing chart in FIG. 8.

In the optical sensor group 110, the photodiode 102A that absorbs visible light and transmits infrared light overlaps with the photodiode 102B absorbing infrared light; thus, 3D imaging and 2D imaging can be performed concurrently.

First, 3D imaging for acquiring 3D range information is described. The optical sensor 100B acquires the first detection signal $S_1$ and the second detection signal $S_2$ in a period from the time T1 to the time T27. The method for driving the optical sensor 100 in the method 1 for driving a semiconductor device can be referred to for this; thus, a detailed description thereof is omitted. By applying such a driving method to a plurality of pixels included in a semiconductor device, a distance between each optical sensor absorbing infrared light and an object can be calculated with higher accuracy.

Next, 2D imaging for acquiring 2D image information is described.

At the time T1, the potential of the signal line 11A is changed from "L" into "H" (reset operation). In addition, the potential of the signal line 12A is changed from "L" into "H". At this time, the photodiode 102A and the transistor 103A are brought into conduction, and the potential of the node 14A is set to "H".

At the time T2, the potential of the signal line 11A is changed from "H" into "L". The potential of the signal line 12A is held to "H". The potential of the node 14A starts to decrease from "H".

Imaging for acquiring 2D image information starts.

In a period from the time T3 to the time T25, the potential of the signal line 12A is held to "H". During this period, the potential of the node 14A keeps decreasing from "H".

At the time T25, the potential of the signal line 12A is changed from "H" into "L". A decrease in potential of the node 14A stops, and the potential of the node 14A is fixed.

The imaging for acquiring 2D image information terminates.

The potential of the node 14A at the time T25 depends on the amount of light delivered to the photodiode 102A in the period from the time T3 to the time T25. As the amount of light is large, a change in potential is increased.

At the time T26, the potential of the signal line 13A is changed from "L" into "H" (reading starts). A potential "H" is supplied to the gate electrode, so that the transistor 105A is turned on. Further, a signal line 15A and the signal line 16A are brought into conduction through the transistor 104A and the transistor 105A.

The potential of the signal line 16A starts to decrease from "H".

Note that the signal line 16A is precharged before the time T26 so that the potential of the signal line 16A is set to "H".

At the time T27, the potential of the signal line 13A is changed from "H" into "L" (the reading terminates). The transistor 105A is turned off, a decrease in potential of the signal line 16A stops, and the potential of the signal line 16A is fixed. The potential of the signal line 16A at the time T27 is denoted by "$V_{S3}$".

By acquiring the potential "$V_{S3}$" of the signal line 16A at the time T27, the amount of light delivered to the photodiode 102A can be detected.

Note that when the light intensity is fixed, the potential "$V_{S3}$" of the signal line 16A is substantially proportional to the irradiation period.

At the time T27, the optical sensor group 110 can acquire the first detection signal $S_1$, the second detection signal $S_2$, and the third detection signal $S_3$.

By applying the above driving method to a plurality of pixels included in a semiconductor device, a distance between each optical sensor absorbing infrared light and an object can be calculated, and at the same time, image information on the object can be obtained by an optical sensor absorbing visible light.

Note that this embodiment can be combined with any of the other embodiments in this specification as appropriate.

Embodiment 2

Figure 9A:
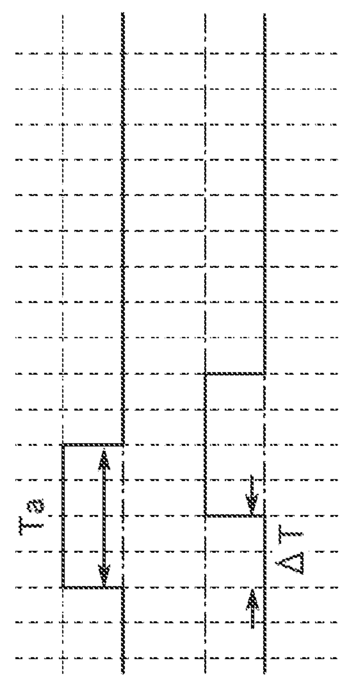
FIGS. 9A and 9B each illustrate the ratio of a delay period.
Figure 9B:
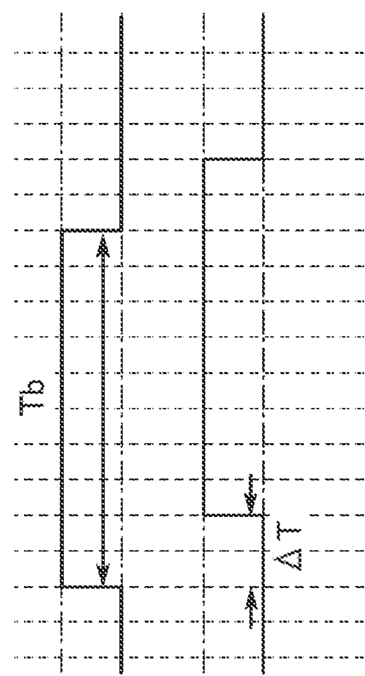

In this embodiment, a method for adjusting the period T, improving the accuracy of a detection signal, and calculating the distance x while the period T in infrared light irradiation is not fixed from the beginning and a distance between a semiconductor device and an object is taken into consideration is described with reference to FIGS. 9A and 9B.

As described in Embodiment 1, the accuracy of a detection signal depends not only the number of infrared light irradiations but also on the ratio of the delay period ΔT in the period T in the infrared light irradiation.

In addition, the period T needs to be longer than at least the delay period ΔT, and is preferably extremely short. In other words, as illustrated in FIGS. 9A and 9B, it is preferable that the infrared light irradiation period be rather a period Ta than a period Tb. The period Ta is shorter than the period Tb. As the period T becomes short, the ratio of the delay period ΔT in the period T can increase; thus, the detection accuracy of the delay period ΔT can be increased. A large change in detection signal with respect to the distance x leads to an increase in accuracy of the distance x.

Note that in Embodiment 1, it is assumed that a detection signal is proportional to net exposure time, that is, the proportional constant α is fixed. However, more commonly, the proportional constant α is not fixed in some cases. This is because the proportional constant α might depend not only net exposure time but also the amplification degree of an optical sensor, the amplification degree of an output circuit, or the like.

Thus, as described in this embodiment, in order to further improve distance detection accuracy, it is effective to adjust the period T so that the first detection signal $S_1$ is equal to the second detection signal $S_2$. Here, the fact that the first detection signal $S_1$ is equal to the second detection signal $S_2$ means that electric charge accumulated in a node FD at the time of acquisition of the first detection signal $S_1$ is equal to electric charge accumulated in the node FD at the time of acquisition of the second detection signal $S_2$, that is, the amount of light delivered to a photodiode is equal. Assuming that the intensity of reflected light is fixed in a period during which the reflected light enters an object, the above condition is only valid when ΔT=T/2.

In other words, when the period T is changed and adjusted so that the first detection signal $S_1$ and the second detection signal $S_2$ are equal, a distance to an object that is calculated according to Formula (A) can be specified independent of the amplification degree of an optical sensor, the amplification degree of an output circuit, or the like.

Specifically, for example, it is assumed that a first detection signal $S_{1m}$ and a second detection signal $S_{2m}$ are equal when the first detection signal $S_1$ and the second detection signal $S_2$ are sequentially acquired while the period T is changed and the period T is 1 ns. By calculating the distance x from the period T and the light speed c according to Formula (A), the distance x is about 7.5 cm. This distance is independent of the amplification degree of an optical sensor, the amplification degree of an output circuit, or the like.

Note that in order to calculate distances to a plurality of points of an object with high accuracy, the distances are determined according to Formula (A) using the first detection signal $S_{1m}$, the second detection signal $S_{2m}$, and the period T at the time when the first detection signal $S_1$ and the second detection signal $S_2$ are sequentially acquired in each point while the period T is changed and the first detection signal $S_1$ and the second detection signal $S_2$ are equal. In other words, it is possible to calculate distances while the period T is set so that the detection accuracy is highest in each point.

Note that also in this embodiment, the number of infrared light irradiations is preferably large.

Thus, high-precision range information can be calculated, and the entire measurement time can be markedly shortened.

Note that this embodiment can be combined with any of the other embodiments in this specification as appropriate.

Embodiment 3

In this embodiment, the structure of the optical sensor 100 in Embodiment 1 is described in more detail. A structure example of a semiconductor device including the optical sensors 100 arranged in a matrix of m rows and n columns is described with reference to FIG. 10A. A structure example that is different from the structure example in FIG. 10A is described with reference to FIG. 10B.

Figure 10A:
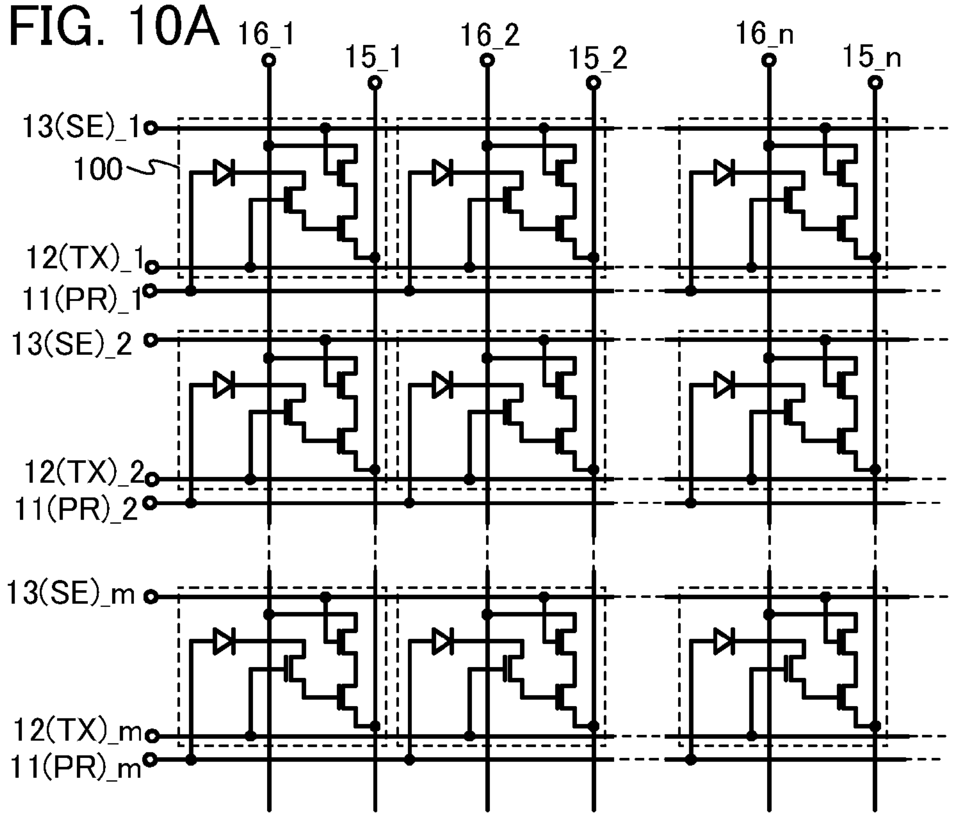
FIGS. 10A and 10B are circuit diagrams of a plurality of optical sensors arranged in matrix.

In FIG. 10A, the plurality of optical sensors 100 are arranged in a matrix of m rows and n columns The optical sensors 100 in each row are electrically connected to any one of a plurality of signal lines 11(PR) (11(PR)_1 to 11(PR)_m), any one of a plurality of signal lines 12(TX) (12(TX)_1 to 12(TX)_m), and any one of a plurality of signal lines 13(SE) (13(SE)_1 to 13(SE)_m). The optical sensors 100 in each column are electrically connected to any one of a plurality of optical sensor output signal lines 16_1 to 16_*n* and any one of a plurality of optical sensor reference signal lines 15_1 to 15_*n*.

In FIG. 10A, the optical sensors in each row share the signal line 12(TX), the signal line 11(PR), and the signal line 13(SE). The optical sensors in each column share the optical sensor output signal line and the optical sensor reference signal line. However, the present invention is not limited thereto. The plurality of signal lines 12(TX) may be provided in each row and electrically connected to the different optical sensors 100. The plurality of signal lines 11(PR) may be provided in each row and electrically connected to the different optical sensors 100. The plurality of signal lines 13(SE) may be provided in each row and electrically connected to the different optical sensors 100. The plurality of optical sensor output signal lines may be provided in each column and electrically connected to the different optical sensors 100. The plurality of optical sensor reference signal lines may be provided in each column and electrically connected to the different optical sensors 100.

In FIG. 10A, the optical sensors in each column share an optical sensor reference signal line; however, the present invention is not limited thereto. An optical sensor reference signal line may be shared by the optical sensors in each row.

The signal line 12(TX) can be shared by the optical sensors 100 that concurrently perform reset operation and accumulation operation among the optical sensors 100 arranged in the matrix of m rows and n columns. The signal line 11(PR) can be shared by the optical sensors that concurrently perform the reset operation and the accumulation operation among the optical sensors 100 arranged in the matrix of m rows and n columns.

As described above, wirings are shared between optical sensors to reduce the number of wirings, so that a driver circuit for driving the optical sensors 100 arranged in the matrix of m rows and n columns can be simplified.

Next, a structure example of a 3D range measurement device including the optical sensors 100 arranged in a matrix of m rows and n columns that is different from the structure example in FIG. 10A is described with reference to FIG. 10B.

Figure 10B:
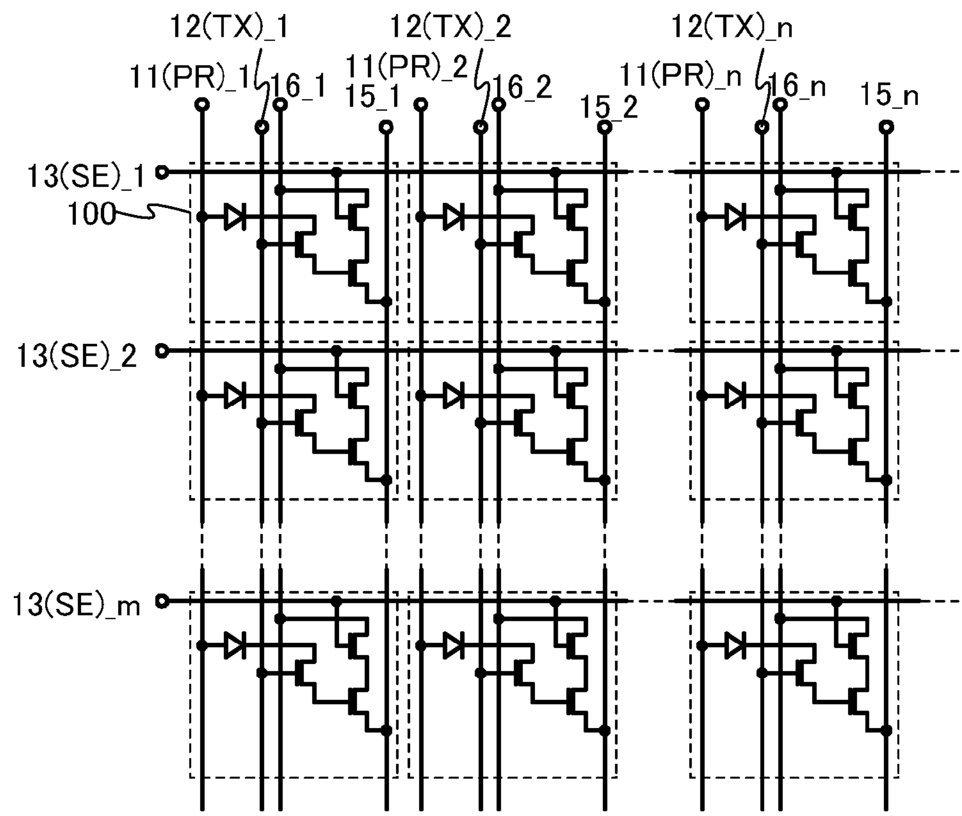

In FIG. 10B, the plurality of optical sensors 100 are arranged in a matrix of m rows and n columns The optical sensors 100 in each row are electrically connected to any one of the plurality of signal lines 13(SE) (13(SE)_1 to 13(SE)_m). The optical sensors 100 in each column are electrically connected to any one of the plurality of signal lines 11(PR) (11(PR)_1 to 11(PR)_n), any one of the plurality of signal lines 12(TX) (12(TX)_1 to 12(TX)_n), any one of the plurality of optical sensor output signal lines 16_1 to 16_*n*, and any one of the plurality of optical sensor reference signal lines 15_1 to 15_*n*.

In FIG. 10B, the optical sensors in each row share the signal line 13(SE), and the optical sensors in each column share the signal line 11(PR), the signal line 12(TX), the optical sensor output signal line, and the optical sensor reference signal line. However, the present invention is not limited thereto.

In FIG. 10B, the optical sensors in each column share an optical sensor reference signal line; however, the present invention is not limited thereto. An optical sensor reference signal line may be shared by the optical sensors in each row.

The signal line 12(TX) can be shared by the optical sensors that concurrently perform reset operation and accumulation operation among the optical sensors 100 arranged in the matrix of m rows and n columns The signal line 11(PR) can be shared by the optical sensors that concurrently perform the reset operation and the accumulation operation among the optical sensors 100 arranged in the matrix of m rows and n columns.

As described above, wirings are shared between optical sensors to reduce the number of wirings, so that a driver circuit for driving the optical sensors 100 arranged in the matrix of m rows and n columns can be simplified.

Figure 11A:
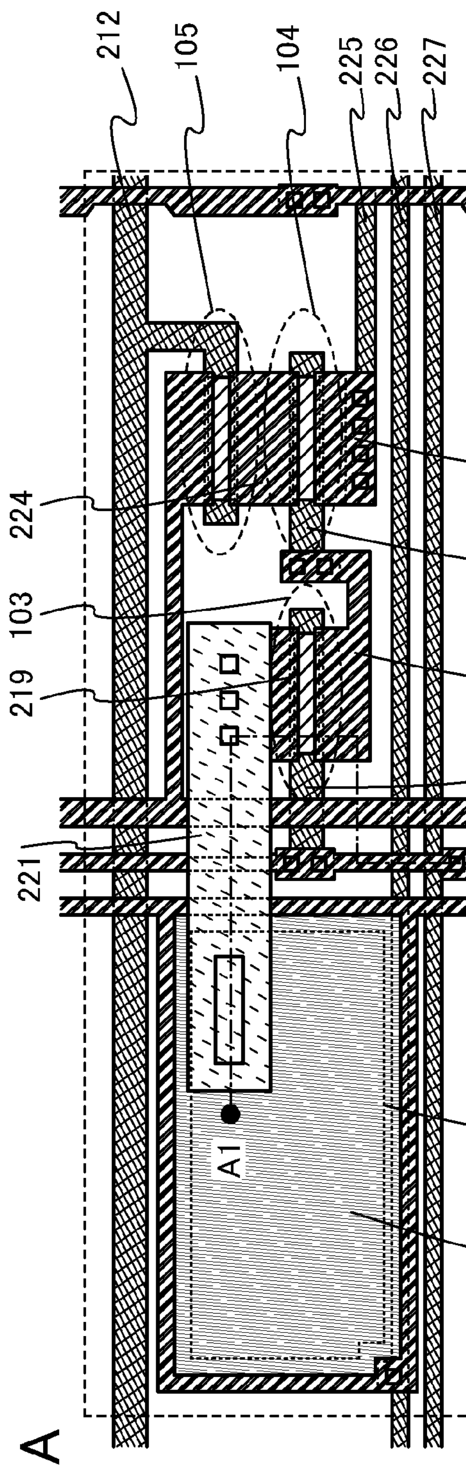
FIGS. 11A and 11B are a top view and a cross-sectional view of an optical sensor.
Figure 11B:
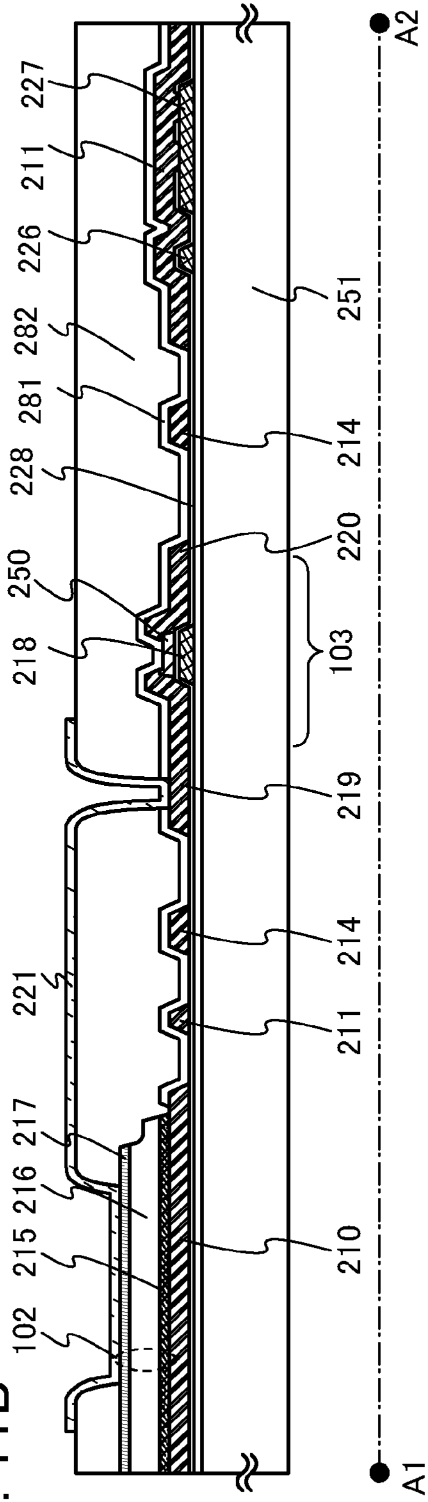

FIG. 11A is a top view of the optical sensor 100. FIG. 11B is a cross-sectional view taken along line A1-A2 in FIG. 11A.

The optical sensor 100 includes a conductive film 210 functioning as the signal line 11(PR), a conductive film 211 functioning as the signal line 12(TX), a conductive film 212 functioning as the signal line 13(SE), a conductive film 213 functioning as the signal line 15 (the optical sensor reference signal line), and a conductive film 214 functioning as the signal line 16 (the optical sensor output signal line).

The photodiode 102 in the optical sensor 100 includes a p-type semiconductor film 215, an i-type semiconductor film 216, and an n-type semiconductor film 217 which are sequentially stacked. The conductive film 210 is electrically connected to the p-type semiconductor film 215 functioning as the anode of the photodiode 102.

A conductive film 218 of the optical sensor 100 functions as the gate electrode of the transistor 103 and is electrically connected to the conductive film 211. A conductive film 219 of the optical sensor 100 functions as one of the source electrode and the drain electrode of the transistor 103. A conductive film 220 of the optical sensor 100 functions as the other of the source electrode and the drain electrode of the transistor 103. A conductive film 221 of the optical sensor 100 is electrically connected to the n-type semiconductor film 217 and the conductive film 219. A conductive film 222 of the optical sensor 100 functions as the gate electrode of the transistor 104 and is electrically connected to the conductive film 220.

A conductive film 223 of the optical sensor 100 functions as one of the source electrode and the drain electrode of the transistor 104. A conductive film 224 of the optical sensor 100 functions as the other of the source electrode and the drain electrode of the transistor 104 and one of the source electrode and the drain electrode of the transistor 105. The conductive film 214 functions as the other of the source electrode and the drain electrode of the transistor 105. The conductive film 212 also functions as the gate electrode of the transistor 105. A conductive film 225 of the optical sensor 100 is electrically connected to the conductive film 223 and the conductive film 213.

Note that in FIGS. 11A and 11B, a conductive film 226 of the optical sensor 100 is electrically connected to the conductive film 210 functioning as the signal line 11(PR). A conductive film 227 of the optical sensor 100 is electrically connected to the conductive film 211 functioning as the signal line 12(TX).

The conductive film 212, the conductive film 218, the conductive film 222, the conductive film 225, the conductive film 226, and the conductive film 227 can be formed by processing one conductive film formed over an insulating surface into a desired shape. A gate insulating film 228 is formed over the conductive film 212, the conductive film 218, the conductive film 222, the conductive film 225, the conductive film 226, and the conductive film 227. The conductive film 210, the conductive film 211, the conductive film 213, the conductive film 214, the conductive film 219, the conductive film 220, the conductive film 223, and the conductive film 224 can be formed by processing one conductive film formed over the gate insulating film 228 into a desired shape.

An insulating film 281 and an insulating film 282 are formed over the conductive film 210, the conductive film 211, the conductive film 213, the conductive film 214, the conductive film 219, the conductive film 220, the conductive film 223, and the conductive film 224. The conductive film 221 is formed over the insulating film 281 and the insulating film 282.

An oxide semiconductor is preferably used for an active layer 250 of the transistor 103. In order to hold electric charge generated by irradiation with light from the substrate 251 side for a long time, the transistor 103 that is electrically connected to the photodiode 102 needs to be a transistor with extremely low off-state current. Thus, by using an oxide semiconductor material for the active layer 250, the performance of the optical sensor 100 can be improved.

Note that in the case where the transistor 103 is a bottom-gate transistor, it is preferable that the active layer 250 be provided over the conductive film 218 functioning as a gate electrode, as illustrated in FIG. 11B. This structure can prevent the oxide semiconductor in the active layer 250 from deteriorating because of light entering from the substrate 251 side, and can thus prevent deterioration in characteristics, such as a shift in threshold voltage of the transistor 103. Note that by employing the above structure for the transistor 104 and the transistor 105, a similar effect can be obtained.

A material such as polycrystalline silicon or single crystal silicon is preferably used for the semiconductor layer of the transistor 104.

A material such as polycrystalline silicon or single crystal silicon is preferably used for the semiconductor layer of the transistor 105.

Here, in the structure where the signal line 12(TX) is extended in a row direction as illustrated in FIG. 10A, the signal line 13(SE) that is also extended in the row direction and is parallel to the signal line 12(TX) exists. When part of the signal line 13(SE) that is electrically connected to the gate electrode of the transistor 105 is used as the gate electrode of the transistor 105, the signal line 12(TX) that is parallel to the signal line 13(SE) is generally formed in the same layer and using the same material as the gate electrode of the transistor 105. In general, however, a material used for a gate electrode of a transistor has higher resistance than that a material used for a source electrode or a drain electrode. Thus, the signal line 12(TX) tends to have high resistance.

In contrast, in the structure of FIG. 10B, the signal line 12(TX) is extended in a column direction. Thus, the signal line 12(TX) can be formed using a conductive film that is formed in a layer different from a layer where the signal line 13(SE) extended in the row direction is formed. For example, as illustrated in FIGS. 11A and 11B, the signal line 12(TX) can be formed using the conductive film 211 that is formed in a layer different from a layer where the conductive films (the conductive films 212, 218, and 222) serving as the gate electrodes of the transistors (the transistors 103, 104, and 105) in the optical sensor 100. The conductive film 211 can be formed in a layer where the source and drain electrodes of the transistors (the transistors 103, 104, and 105) in the optical sensor 100 are formed, that is, in a layer where the conductive films 214, 219, 220, and 224 are formed, using the same material as the source and drain electrodes. Thus, the resistance of the signal line 12(TX) in this structure is lower than that in the structure in FIG. 10A.

Note that this embodiment can be combined with any of the other embodiments in this specification as appropriate.

Embodiment 4

In this embodiment, a structure example of an organic EL display device including the optical sensor in Embodiments 1 to 3 is described with reference to FIG. 12. The organic EL display device has a structure where three n-channel transistors and a photodiode are stacked on a single crystal semiconductor substrate (e.g., a single crystal silicon substrate).

A substrate 411 is formed using single crystal silicon having comparatively high resistance (e.g., n-type single crystal silicon having a resistance of approximately 10 Ω·cm), and n-wells 412, 413, 414, and 415 are formed in a self-aligning manner. Adjacent transistors are separated by a field oxide film 416. In the formation of the field oxide film 416, a channel stopper may be formed by selective introduction of boron (B) into the substrate by ion implantation.

Gate insulating films 417, 418, and 419 are formed by thermal oxidation.

Gates 420, 421, and 422 are formed using a stack of polycrystalline silicon layers 420*a*, 421*a*, and 422*a* obtained by formation of a polycrystalline silicon film to a thickness of 100 to 300 nm by CVD and silicide layers 420*b*, 421*b*, and 422*b* each having a thickness of 50 to 300 nm In order to reduce resistance, the polycrystalline silicon layers may be doped with phosphorus (P) at a concentration of approximately $10^{21}/cm^3$ in advance, or an n-type impurity may be diffused into the polycrystalline silicon layers at a high concentration after forming the polycrystalline silicon films. The silicide layers can be formed using molybdenum silicide ($MoSi_x$), tungsten silicide ($WSi_x$), tantalum silicide ($TaSi_x$), titanium silicide ($TiSi_x$), or the like and may be formed by a known method.

Phosphorus (P) or arsenic (As) is added to low-concentration drain (LDD) regions 423, 424, and 425 of the n-channel transistors as an impurity element imparting n-type conductivity at a dosage of $1\times10^{13}$ to $1\times10^{14}/cm^2$. These LDD regions are formed in a self-aligning manner using gates as masks by ion implantation or ion doping.

Note that in this embodiment, a transistor 403, a transistor 404, and a transistor 405 are n-channel transistors; however, this embodiment is not limited to this structure. The transistor 403, the transistor 404, and the transistor 405 may be p-channel transistors, or may be a mixture of an n-channel transistor and a p-channel transistor.

In the case where the transistor 403, the transistor 404, and the transistor 405 are p-channel transistors, boron (B) may be added to low-concentration drain (LDD) regions of the p-channel transistors as an impurity element imparting p-type conductivity at a dosage of $1\times10^{13}$ to $1\times10^{14}/cm^2$.

After the LDD regions are formed, an insulating film is formed over the entire surface using a silicon oxide film, a silicon nitride film, or the like by CVD. Anisotropic etching is uniformly performed on the entire surface of the insulating film to leave the insulating film on sidewalls of the gates, so that sidewalls 426, 427, and 428 are formed. Source regions and drain regions of the transistors are formed using these sidewalls as masks.

Arsenic (As) is introduced into the n-channel transistors by ion implantation at a dosage of $5\times10^{14}$ to $1\times10^{16}/cm^2$, so that source regions 430, 431, and 432 and drain regions 433, 434, and 435 are formed.

When the transistor 403, the transistor 404, and the transistor 405 are p-channel transistors, boron (B) may be added by ion implantation at a dosage of $5\times10^{14}$ to $1\times10^{16}/cm^2$ to form the source and drain regions.

A first interlayer insulating film 436 is preferably formed to a thickness of 100 to 2000 nm using a silicon oxide film, a silicon oxynitride film, or the like formed by plasma-enhanced CVD or low pressure CVD.

Further, a second interlayer insulating film 437 is formed over the first interlayer insulating film 436 by using phosphosilicate glass (PSG), borosilicate glass (BSG), phosphoborosilicate glass (PBSG), or the like. The second interlayer insulating film 437 is formed by spin coating or atmospheric pressure CVD. The second interlayer insulating film 437 is reflowed by thermal activation treatment (heat treatment) performed at 700 to 900° C. after the formation, and a surface of the second interlayer insulating film 437 is flattened.

Source wirings 440, 441, and 442 and drain wirings 443, 444, and 445 are formed to be in contact with the source and drain regions of the n-channel transistors after contact holes are formed in the first interlayer insulating film 436 and the flattened second interlayer insulating film 437. It is preferable to use aluminum, which is usually used as a low-resistance material, for the source and drain wirings. The source and drain wirings may have a layered structure of a refractory metal film and a low-resistance metal film (e.g., an aluminum alloy or pure aluminum).

An electrode 446 is formed in the same layer as the source and drain wirings.

A passivation film 447 is formed using a silicon nitride film, a silicon oxide film, a silicon nitride oxide film, or the like by plasma-enhanced CVD.

A third interlayer insulating film 448 is formed over the passivation film 447. A surface of the third interlayer insulating film 448 is reflowed and flattened.

Contact holes are formed in the passivation film 447 and the flattened third interlayer insulating film 448, and an electrode 449 that is in contact with the electrode 446, an electrode 450 that is in contact with the source wiring 440, and an electrode 451 that is in contact with the drain wiring 445 are formed.

An electrode 452 that is in contact with the electrode 449, an electrode 453 that is in contact with the electrode 450, and an electrode 454 that is in contact with the electrode 451 are formed over the third interlayer insulating film 448. It is preferable to use aluminum, which is usually used as a low-resistance material, for the electrodes 452, 453, and 454. The electrodes 452, 453, and 454 may have a layered structure of titanium, aluminum, and titanium.

A photodiode 402 formed in an upper portion and the transistor 403 formed in a lower portion can be electrically connected to each other with the electrodes 450 and 453.

Figure 12:
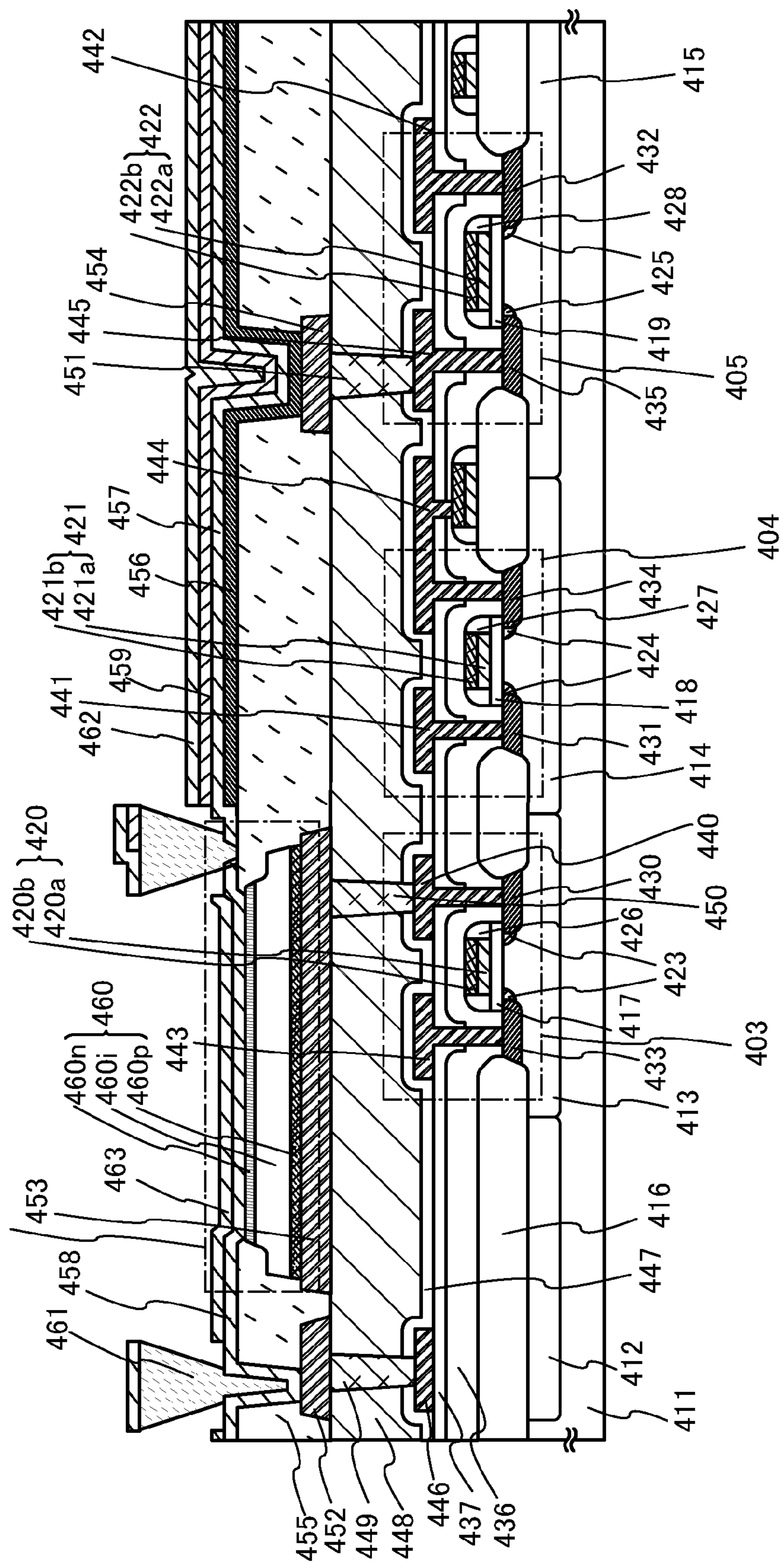
FIG. 12 is a cross-sectional view of a display device.

The photodiode 402 in FIG. 12 includes a first electrode, a second electrode, and a photoelectric conversion layer positioned between these two electrodes. A photoelectric conversion layer 460 includes a p-type semiconductor layer 460*p*, an n-type semiconductor layer 460*n*, and an intrinsic (i-type) semiconductor layer 460*i* positioned between the p-type semiconductor layer 460*p* and the n-type semiconductor layer 460*n*.

Note that the photodiode 402 is not limited to this structure, and the photodiode 402 may have at least a layered structure of a p-type semiconductor layer and an n-type semiconductor layer.

The p-type semiconductor layer 460*p* may be formed using a semi-amorphous silicon film including a Group 13 impurity element of the Periodic Table, e.g., boron (B) by plasma-enhanced CVD. Alternatively, after a semi-amorphous silicon film is formed, a Group 13 impurity element of the Periodic Table may be introduced.

After the p-type semiconductor layer 460*p* is formed, the semiconductor layer 460*i* which does not include an impurity imparting conductivity (referred to as an intrinsic semiconductor layer or an i-type semiconductor layer) is stacked over the p-type semiconductor layer 460*p*. As the i-type semiconductor layer 460*i*, for example, a semi-amorphous silicon film may be formed by plasma-enhanced CVD.

In addition, the n-type semiconductor layer 460*n* is stacked over the i-type semiconductor layer 460*i*. As the n-type semiconductor layer 460*n*, a semi-amorphous silicon film including a Group 15 impurity element of the Periodic Table, e.g., phosphorus (P) may be formed. Alternatively, after a semi-amorphous silicon film is formed, a Group 15 impurity element of the Periodic Table may be introduced.

Thus, the photoelectric conversion layer 460 including the p-type semiconductor layer 460*p*, the i-type semiconductor layer 460*i*, and the n-type semiconductor layer 460*n* is formed.

Note that in this specification, an i-type semiconductor layer means a semiconductor layer in which the concentration of an impurity imparting p-type or n-type conductivity is $1\times10^{20}$ cm$^{-3}$ or lower, and the concentration of oxygen and nitrogen is $5\times10^{19}$ cm$^{-3}$ or lower. Photoconductivity is preferably 1000 times or more dark conductivity. In addition, boron (B) may be added to the i-type semiconductor layer at 10 to 1000 ppm.

Alternatively, an amorphous semiconductor film as well as a semi-amorphous semiconductor film may be used for each of the i-type semiconductor layer 460*i*, the p-type semiconductor layer 460*p*, and the n-type semiconductor layer 460*n*.

A fourth interlayer insulating film 455 is formed to a thickness of 1 to 2 μm over the electrode 452, the electrode 454, and the photoelectric conversion layer 460 by using an organic resin material. Polyimide or the like that is thermopolymerized after it is applied on the substrate may be heated and baked at 300° C. with a clean oven to form the fourth interlayer insulating film 455.

As the organic resin material, polyimide, polyamide, acrylic, benzocyclobutene (BCB), or the like can be used. It is advantageous to use an organic resin material in that, for example, a film formation method is simple, parasitic capacitance can be reduced because of a low dielectric constant, and it is suitable for flattening. It is needless to say that an organic resin material other than the above organic resin material may be used.

A pixel electrode 456 is formed over the fourth interlayer insulating film 455. The pixel electrode 456 is electrically connected to the drain wiring 445 of the transistor 405 through the electrodes 451 and 454. The pixel electrode 456 can be electrically connected to the transistor 405 through the electrodes 451 and 454.

The pixel electrode 456 is preferably formed using a low-resistance material typified by Al. For the deposition of an Al film, a known deposition method such as vacuum vapor deposition or sputtering can be used. In order to improve contrast, a surface of the pixel electrode 456 may be made uneven to be a diffusion reflection surface.

A first transparent conductive film is formed over the pixel electrode 456 and the fourth interlayer insulating film 455 and is partly etched through photolithography, so that transparent conductive films 457 and 458 are formed.

The transparent conductive film 457 is formed to be in contact with the pixel electrode 456 and functions as an anode or a cathode of a light-emitting element. The light-emitting element includes a first electrode (an anode), a second electrode (a cathode), and an organic EL layer positioned between these two electrodes.

The transparent conductive film 458 is formed to be in contact with the n-type semiconductor layer 460*n* and the electrode 452 through a contact hole formed in the fourth interlayer insulating film 455.

Indium tin oxide (ITO) or the like can be used for the transparent conductive films 457 and 458.

The transparent conductive film 458 formed in the upper portion can be electrically connected to the electrode 446 formed in the lower portion through the electrodes 449 and 452.

A plurality of inversely-tapered partitions 461 are formed over the transparent conductive films 457 and 458 and the fourth interlayer insulating film 455. A cross section of the partition 461 is inversely-tapered, and an upper surface of the partition 461 has a frame shape. Note that the frame shape may be a curved shape having a rounded corner, and may be any shape as long as two closed loops are not in contact with each other and a hollow exists in the center. The inversely-tapered partitions 461 are formed in such a manner that, through photolithography, a positive photosensitive resin, an unexposed portion of which serves as a pattern, is used and the amount of exposed light or the length of development time is adjusted so that a lower portion of the pattern is etched more.

An organic electroluminescent layer (EL layer) 459 is formed over the partitions 461 and the transparent conductive film 457. The organic EL layer 459 can be formed by a known material or structure.

As the organic EL layer 459, an organic EL layer including only a light-emitting layer where recombination occurs may be used, or as necessary, a stack of an electron injection layer, an electron transport layer, a hole transport layer, an electron blocking layer, a hole blocking layer, and a hole injection layer may be used. As the material of the organic EL layer 459, a polymer organic EL material can be used.

For example, the organic EL layer 459 may be formed in such a manner that polyvinylcarbazole (PVK), Bu-PBD(2-(4'-tert-butylphenyl)-5-(4"-biphenyl)-1,3,4-oxadiazole), cumarin 6, DCM1(4-dicyanomethylene-2-methyl-6-p-dimethylaminostyryl-4H-pyran), tetraphenylbutadiene (TPB), or Nile red is dissolved in 1,2-dichloromethane or chloroform and is applied by spin coating.

A second transparent conductive film is formed over the partitions 461, the organic EL layer 459, and the transparent conductive film 458 and is partly etched through photolithography, so that transparent conductive films 462 and 463 are formed. ITO or the like can be used for the transparent conductive films 462 and 463.

The transparent conductive film 462 is formed to be in contact with the organic EL layer 459 and functions as the anode or the cathode of the light-emitting element.

Note that there is no limitation on the transparent conductive film 457 and the transparent conductive film 462 in this embodiment as long as one of them is an anode and the other is a cathode.

The height of the partition 461 is greater than the thickness of the second transparent conductive film; thus, the transparent conductive films 462 and 463 are divided into a plurality of regions. Note that the plurality of divided regions are electrically isolated from each other. The potential of the transparent conductive film formed over the partition 461 is floating.

Since light to be detected passes through the transparent conductive films 458 and 463, materials having high light-transmitting properties are preferably used as materials thereof.

Note that if necessary, a sealing material such as a sealing can or a glass substrate may be attached to the substrate 411 for sealing with an adhesive such as a sealant, so that the light-emitting element is placed in an enclosed space. Thus, deterioration of the light-emitting element can be prevented. The enclosed space may be filled with filler or a dry inert gas. Further, a desiccant or the like may be put between the substrate and the sealant in order to prevent deterioration of the light-emitting element due to moisture or the like. The desiccant removes a slight amount of moisture, thereby achieving sufficient desiccation. The desiccant can be a substance that adsorbs moisture by chemical adsorption, such as an oxide of an alkaline earth metal typified by calcium oxide or barium oxide. Additionally, a substance that adsorbs moisture by physical adsorption, such as zeolite or silica gel, may be used as the desiccant.

Note that the transistors 403, 404, and 405 may each be a transistor which has a channel formation region in a semiconductor film such as a silicon film formed over an insulating surface or a silicon film of an SOI substrate. A known structure can be used as the structure of each of the transistors.

Further, although FIG. 12 illustrates a structure where one wiring layer is provided between the layer in which the photodiode 402 is formed and the layer in which the transistors 403, 404, and 405 are formed, this embodiment is not limited thereto. Two or more wiring layers may be provided between the layer in which the photodiode 402 is formed and the layer in which the transistors 403, 404, and 405 are formed.

By stacking the photodiode 402 and the transistors 403, 404, and 405 as described above, the area of the optical sensor can be reduced, so that downsizing can be achieved.

This embodiment can be combined with any of the above embodiments as appropriate.

Embodiment 5

In this embodiment, the structures of an optical sensor 100_(*k*−1) and an optical sensor 100_(*k*) (hereinafter these optical sensors are also collectively referred to as an optical sensor group 120) adjacent to each other in Embodiment 1 are described in more detail. A structure example of a semiconductor device including the optical sensor groups 120 arranged in a matrix of m rows and n columns is described with reference to FIGS. 13A and 13B.

Figure 13A:
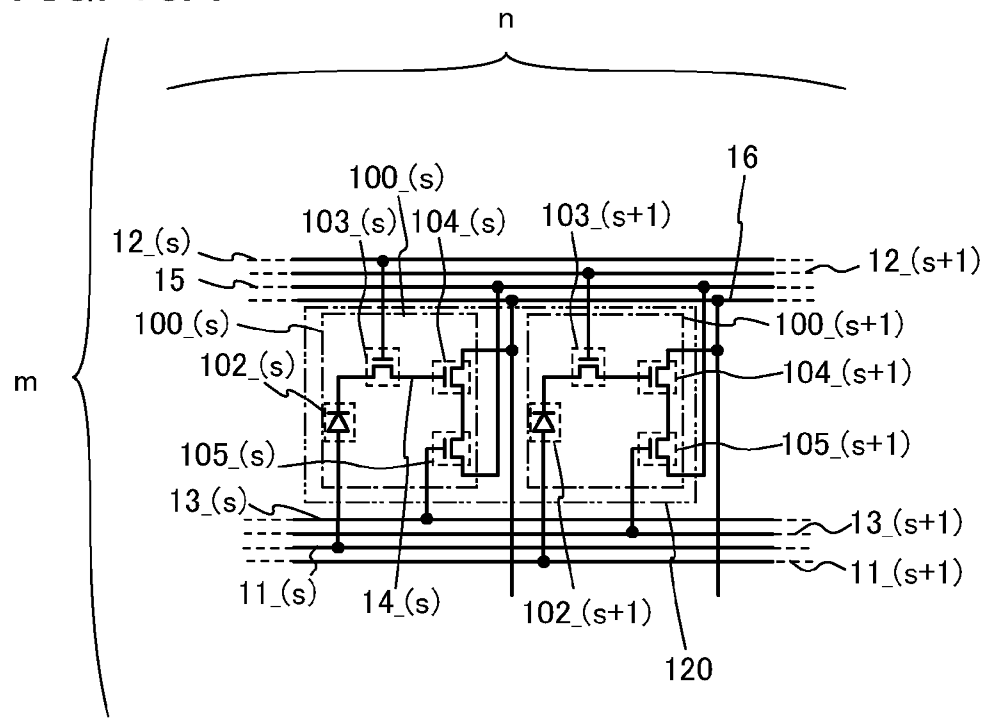
FIGS. 13A and 13B are circuit diagrams of a plurality of optical sensors arranged in matrix.
Figure 13B:
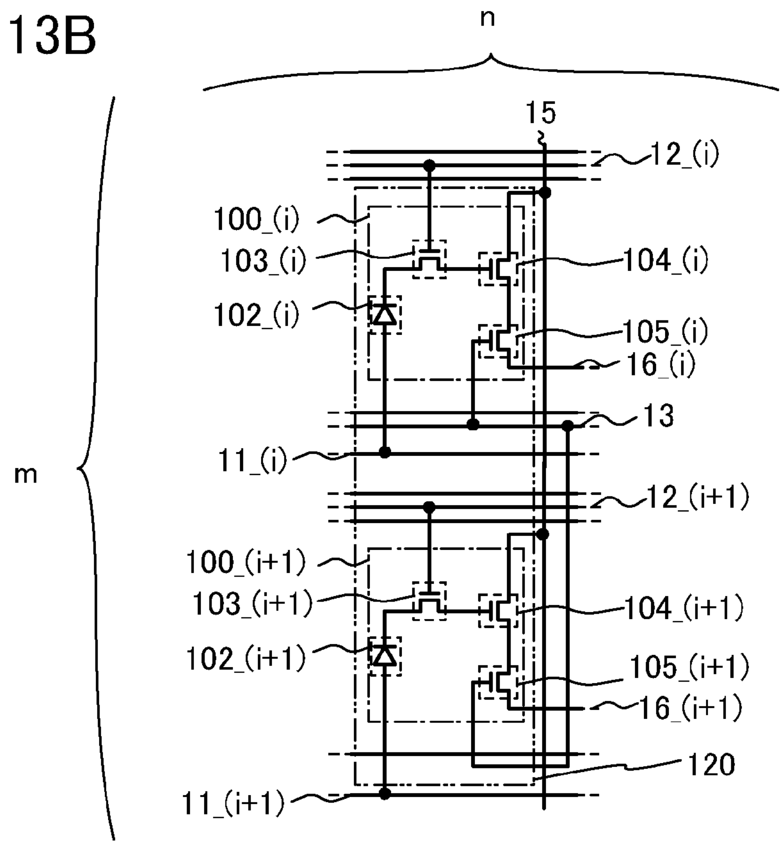

FIG. 13A illustrates the case where an optical sensor 100_(s) and an optical sensor 100_(s+1) (s is an odd number of 1 or more and (2n−1) or less) in adjacent columns detect light reflected from the same point of an object. FIG. 13B illustrates the case where an optical sensor 100_(*i*) and an optical sensor 100_(*i*+1) (i is an odd number of 1 or more and (2m−1) or less) in adjacent rows detect light reflected from the same point of an object. Note that these structures produce the same effect; thus, either of these structures can be used.

In FIG. 13A, the plurality of optical sensor groups 120 are arranged in a matrix of m rows and n columns. For example, the optical sensor 100_(*s*) and the optical sensor 100_(*s*+1) adjacent to each other in a first row detect light reflected from the same point of an object. Similarly, the optical sensor 100_(*s*) and the optical sensor 100_(*s*+1) adjacent to each other in an m-th row detect light reflected from the same point of an object.

The optical sensor groups 120 in each row share an optical sensor reference signal line. For example, an optical sensor reference signal line 15_(1) in the first row is electrically connected to an optical sensor group 120_(1) in the first row and a first column to an optical sensor group 120_(*n*) in the first row and an n-th column. An optical sensor reference signal line 15_(*m*) in the m-th row is electrically connected to the optical sensor group 120_(1) in the m-th row and the first column to the optical sensor group 120_(*n*) in the m-th row and the n-th column.

The optical sensor groups 120 in each row also share an optical sensor output signal line. For example, an optical sensor output signal line 16_(1) in the first row is electrically connected to the optical sensor group 120_(1) in the first row and the first column to the optical sensor group 120_(*n*) in the first row and the n-th column. An optical sensor output signal line 16_(*m*) in the m-th row is also electrically connected to the optical sensor group 120_(1) in the m-th row and the first column to the optical sensor group 120_(*n*) in the m-th row and the n-th column.

In FIG. 13A, the optical sensors in each row share the optical sensor reference signal line 15 and the optical sensor output signal line 16.

However, the present invention is not limited thereto. For example, the plurality of optical sensor reference signal lines 15 may be provided in each column and electrically connected to the different optical sensors. The plurality of optical sensor output signal lines 16 may be provided in each column and electrically connected to the different optical sensors.

Note that in FIG. 13A, the optical sensors in each row share the optical sensor reference signal line 15 and the optical sensor output signal line 16; however, the present invention is not limited thereto. The optical sensor reference signal line 15 and the optical sensor output signal line 16 may be shared by the optical sensors in each column.

As described above, wirings are shared between optical sensors to reduce the number of wirings, so that a driver circuit for driving the optical sensor groups arranged in the matrix of m rows and n columns can be simplified.

Next, a structure example of a semiconductor device including the optical sensor groups 120 arranged in the matrix of m rows and n columns that is different from the structure example in FIG. 13A is described with reference to FIG. 13B. In FIG. 13B, the plurality of optical sensor groups 120 are arranged in the matrix of m rows and n columns. For example, the optical sensor 100_(*i*) and the optical sensor 100_(*i*+1) adjacent to each other in the first column detect light reflected from the same point of an object. Similarly, the optical sensor 100_(*i*) and the optical sensor 100_(*i*+1) adjacent to each other in the n-th column detect light reflected from the same point of an object.

The optical sensor groups in each row share the signal line 13. For example, the signal line 13 in the first row is electrically connected to the optical sensor group 120_(1) in the first row and the first column to the optical sensor group 120_(*n*) in the first row and an n-th column. The signal line 13_(*m*) in the m-th row is also electrically connected to the optical sensor group 120_(1) in the m-th row and the first column to the optical sensor group 120_(*n*) in the m-th row and the n-th column.

The optical sensor groups in each column share the optical sensor reference signal line 15. For example, as illustrated in FIG. 13B, the optical sensor groups in the n-th column share the optical sensor reference signal line 15.

However, the present invention is not limited thereto. For example, the plurality of optical sensor reference signal lines 15 may be provided in each column and electrically connected to the different optical sensors.

Although the optical sensor reference signal line 15 is shared by the optical sensors in each column and the signal line 13 is shared by the optical sensors in each row in FIG. 13B, the present invention is not limited thereto. The optical sensor reference signal line 15 may be shared by the optical sensors in each row and the signal line 13 may be shared by the optical sensors in each column.

As described above, wirings are shared between optical sensors to reduce the number of wirings, so that a driver circuit for driving the optical sensor groups arranged in the matrix of m rows and n columns can be simplified.

This embodiment can be combined with any of the above embodiments as appropriate.

Embodiment 6

Figure 14:
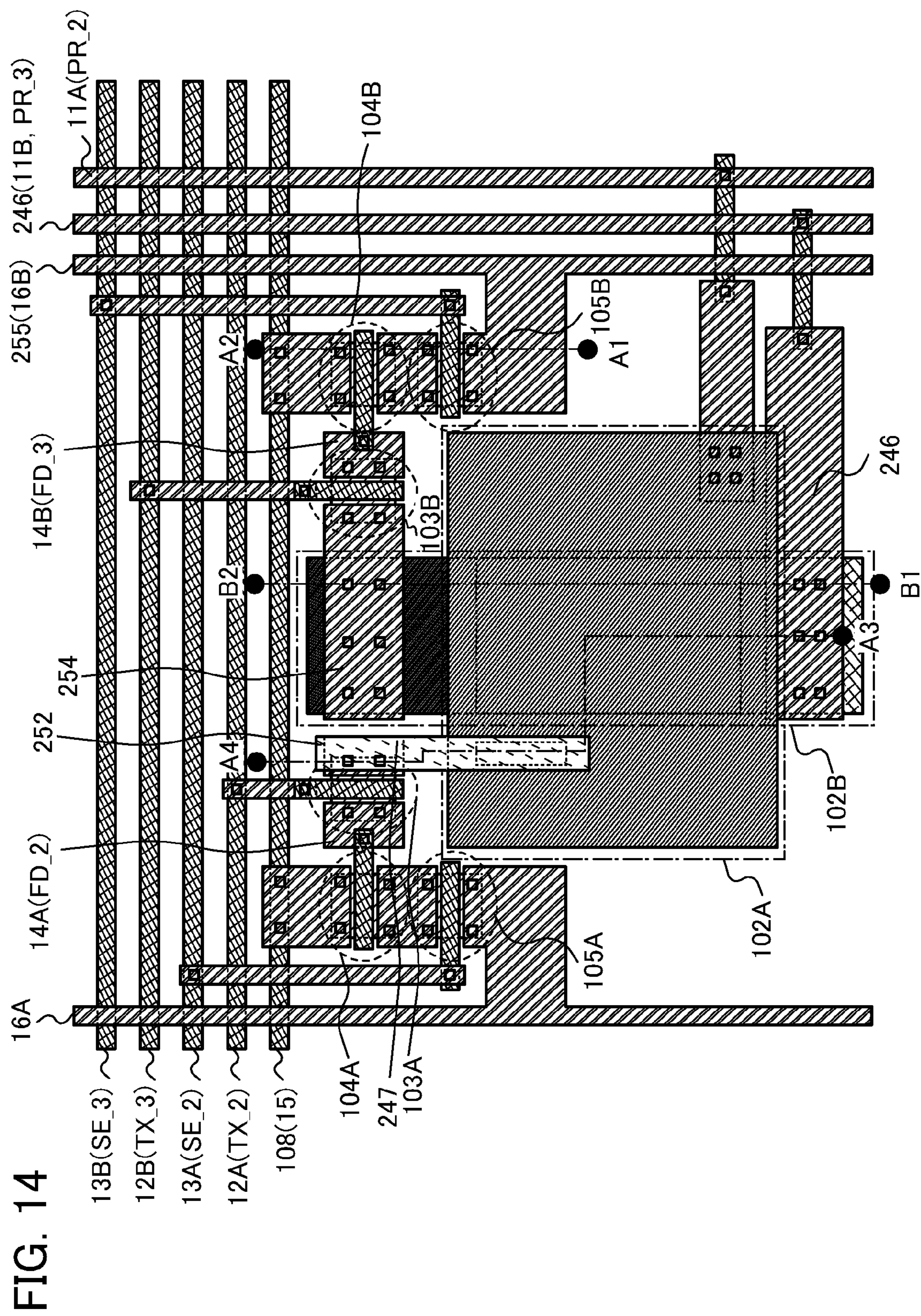
FIG. 14 is a top view of an optical sensor.
Figure 15A:
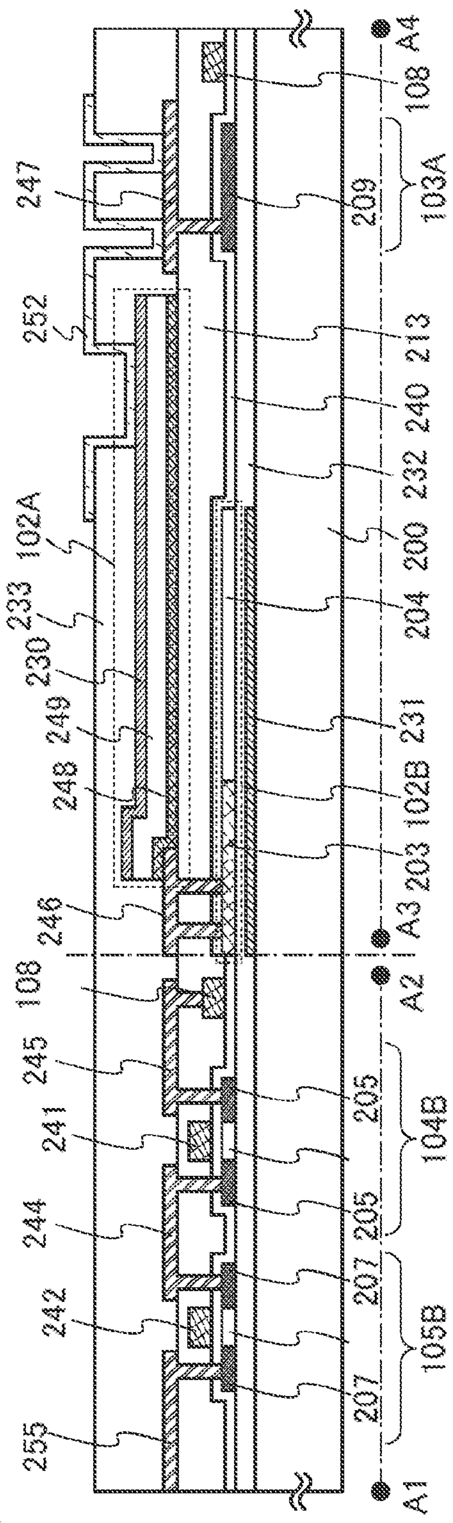
FIGS. 15A and 15B are cross-sectional views of an optical sensor.
Figure 15B:
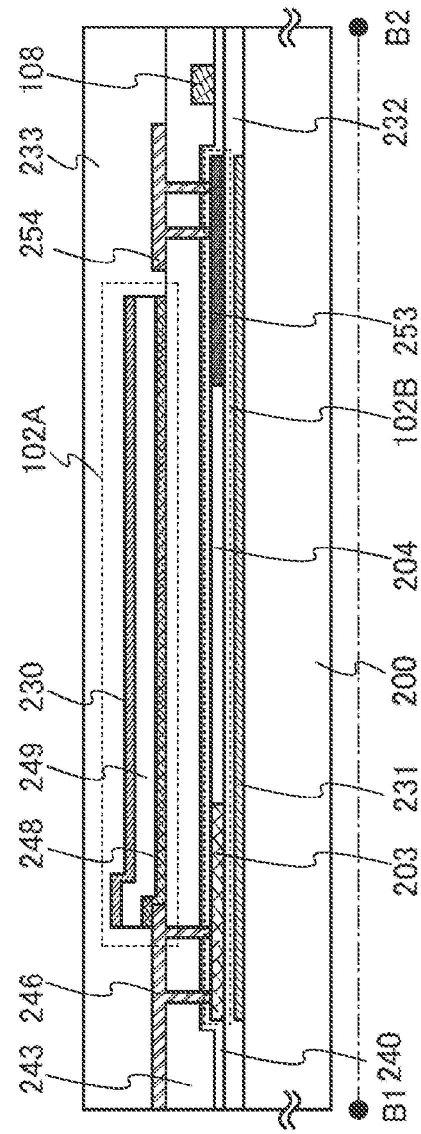

Next, examples of a top view and cross-sectional views of the optical sensor group 110 in FIG. 4 are described. FIG. 14 is an example of a top view of the optical sensor group 110. FIG. 15A is a cross-sectional view taken along dashed line A1-A2 and dashed line A3-A4 in FIG. 14. FIG. 15B is a cross-sectional view taken along dashed line B1-B2 in FIG. 14.

FIG. 15A is described. In the cross-sectional view in FIG. 15A, a light-blocking layer 231 and a base film 232 are provided over a light-transmitting substrate 200.

On and in contact with the base film 232, a p-type semiconductor region 203 and an i-type semiconductor region 204 in a semiconductor layer of the photodiode 102B absorbing infrared light, n-type semiconductor regions 205 and an i-type semiconductor region 206 in a semiconductor layer of the transistor 104B, n-type semiconductor regions 207 and an i-type semiconductor region 208 in a semiconductor layer of the transistor 105B, and an n-type semiconductor region 209 in a semiconductor layer of the transistor 103A are provided.

Note that the p-type semiconductor region 203, the i-type semiconductor region 204, the n-type semiconductor regions 205, the i-type semiconductor region 206, the n-type semiconductor regions 207, the i-type semiconductor region 208, and the n-type semiconductor region 209 are formed in the same layer.

An insulating layer 240 is provided over the semiconductor layer of the photodiode 102B, the semiconductor layer of the transistor 104B, the semiconductor layer of the transistor 105B, and the semiconductor layer of the transistor 103A.

A conductive layer 108 is provided on and in contact with the insulating layer 240. A gate electrode 241 of the transistor 104B is provided over the i-type semiconductor region 206 with the insulating layer 240 provided therebetween. A gate electrode 242 of the transistor 105B is provided over the i-type semiconductor region 208 with the insulating layer 240 provided therebetween. The conductive layer 108, the gate electrode 241, and the gate electrode 242 are formed in the same layer.

Note that the conductive layer 108 is electrically connected to the signal line 15 (the optical sensor reference signal line).

An insulating layer 243 is provided over the insulating layer 240, the conductive layer 108, the gate electrode 241, and the gate electrode 242.

A conductive layer 255 is provided on and in contact with one of the n-type semiconductor regions 207 of the transistor 105B with the insulating layers 240 and 243 provided therebetween. A conductive layer 245 is provided on and in contact with one of the n-type semiconductor regions 205 of the transistor 104B with the insulating layers 240 and 243 provided therebetween. A conductive layer 244 is provided on and in contact with the other of the n-type semiconductor regions 207 of the transistor 105B and the other of the n-type semiconductor regions 205 of the transistor 104B with the insulating layers 240 and 243 provided therebetween. The conductive layer 255, the conductive layer 245, and the conductive layer 244 are formed in the same layer.

Note that the conductive layer 255 is electrically connected to the signal line 16B (the optical sensor output signal line) and one of the source electrode and the drain electrode of the transistor 105B. A conductive layer 245 is electrically connected to the signal line 15 and one of the source electrode and the drain electrode of the transistor 104B. A conductive layer 244 is electrically connected to the other of the source electrode of the transistor 104B and the other of the source electrode of the transistor 105B.

Similarly, a conductive layer 247 is provided on and in contact with the n-type semiconductor region 209 of the transistor 103A with the insulating layers 240 and 243 provided therebetween. A conductive layer 246 is provided on and in contact with the p-type semiconductor region 203 of the photodiode 102B with the insulating layers 240 and 243 provided therebetween. The conductive layer 247 and the conductive layer 246 are formed in the same layer.

Note that the conductive layer 246 is electrically connected to the signal line 11B (the reset signal line), and the conductive layer 247 is electrically connected to one of the source electrode and the drain electrode of the transistor 103A.

A p-type semiconductor region 248, an i-type semiconductor region 249, and an n-type semiconductor region 230 of the photodiode 102A are provided over the insulating layer 243 and the conductive layer 246. Note that the p-type semiconductor region 248 of the photodiode 102A is provided so that an end portion thereof is stacked over the conductive layer 246.

An insulating layer 233 is provided over a semiconductor layer of the photodiode 102A, the conductive layer 244, the conductive layer 245, the conductive layer 246, the conductive layer 247, the conductive layer 255, and the insulating layer 243.

A conductive layer 252 is provided over the n-type semiconductor region 230 and the conductive layer 247 with the insulating layer 233 provided therebetween.

Note that the conductive layer 252 functions as a pixel electrode.

Next, FIG. 15B is described. In the cross-sectional view in FIG. 15B, the light-blocking layer 231 and the base film 232 are provided over the light-transmitting substrate 200.

The p-type semiconductor region 203, the i-type semiconductor region 204, and an n-type semiconductor region 253 in the semiconductor layer of the photodiode 102B absorbing infrared light are provided over the light-blocking layer 231 with the base film 232 provided therebetween.

The insulating layer 240 is provided over the semiconductor layer of the photodiode 102B and the base film 232.

The conductive layer 108 is provided on and in contact with the insulating layer 240.

The insulating layer 243 is provided over the insulating layer 240 and the conductive layer 108.

The conductive layer 246 is provided on and in contact with the p-type semiconductor region 203 of the photodiode 102B with the insulating layers 240 and 243 provided therebetween. A conductive layer 254 is provided on and in contact with the n-type semiconductor region 253 of the photodiode 102B with the insulating layers 240 and 243 provided therebetween. The conductive layer 246 and the conductive layer 254 are formed in the same layer.

Note that the conductive layer 246 is electrically connected to an anode of the photodiode 102B, and the conductive layer 254 is electrically connected to one of the source electrode and the drain electrode of the transistor 103B and a cathode of the photodiode 102B.

The insulating layer 233 is provided over the semiconductor layer of the photodiode 102A, the conductive layer 246, the conductive layer 254, and the insulating layer 243.

The light-transmitting substrate 200 is preferably a substrate formed using a material that transmits visible light and infrared light. For example, a plastic substrate, a glass substrate, or the like that transmits visible light and infrared light can be used.

Alternatively, the light-transmitting substrate 200 may be a light-transmitting flexible sheet or the like.

Note that there is no particular limitation on a light source (a backlight) as long as the light source can emit infrared light and visible light from the light-transmitting substrate 200 side. For example, a light-emitting diode that emits infrared light and a light-emitting diode that emits visible light may be disposed.

Note that the light source may be provided on the light-transmitting substrate 200 side or on a counter substrate side as long as the photodiode 102A can detect visible light and the photodiode 102B can detect infrared light.

The light-blocking layer 231 can be formed using a metal material such as aluminum or chromium, which can block infrared light and visible light.

The light-blocking layer 231 can prevent infrared light and visible light from a light source provided on the light-transmitting substrate 200 side from entering the photodiode 102A and the photodiode 102B.

It is preferable that the light-blocking layer 231 be provided not only in a region overlapping with the photodiode 102B but also in a region overlapping with the semiconductor layers of the transistors 103, 104, and 105. By providing the light-blocking layer in the region overlapping with the semiconductor layers of the transistors, deterioration in characteristics, such as a shift in threshold voltage of the transistor, due to infrared light and visible light from the light source can be prevented.

The base film 232 is preferably formed using a light-transmitting insulating material such as silicon oxide, silicon nitride, silicon oxynitride, or silicon nitride oxide. The base film 232 may have a single-layer structure or a layered structure.

The base film 232 can prevent an alkali metal such as Na or an alkaline earth metal included in the light-transmitting substrate 200 from diffusing into the photodiode 102B and adversely affecting the characteristics of the transistors and the photodiodes.

Note that a surface of the base film 232 preferably has a high degree of flatness. The base film 232 having a high degree of flatness can prevent defects at the time of formation of the semiconductor layer of the photodiode 102B.

For the semiconductor layer of the photodiode 102A, a material that absorbs mainly visible light and transmits most of infrared light is preferably used. For example, amorphous silicon or the like can be used.

For the semiconductor layer of the photodiode 102B, a material that absorbs infrared light is preferably used. For example, crystalline silicon such as polycrystalline silicon or single crystal silicon can be used.

In FIG. 14, the signal line 11, the signal line 12, the signal line 13, the node 14, the signal line 15, and the signal line 16 are a reset signal line (PR), an electric charge accumulation signal line (TX), a selection signal line (SE), a floating diffusion (FD) node, an optical sensor reference signal line, and an optical sensor output signal line, respectively.

Note that a semiconductor material used for the transistors 103, 104, and 105 is preferably selected as appropriate according to intended use.

The insulating layer 240 can be formed using a light-transmitting insulating material such as a silicon oxide film, a silicon oxynitride film, a silicon nitride oxide film, or an organic resin film. The insulating layer 240 may have a single-layer structure or a layered structure.

The insulating layer 240 can prevent an alkali metal such as Na or an alkaline earth metal from the outside from diffusing into the photodiode 102B and adversely affecting the characteristics.

A conductive metal material can be used for the gate electrode 241, the gate electrode 242, and the conductive layer 108. A metal material such as molybdenum, titanium, chromium, tantalum, tungsten, aluminum, copper, neodymium, or scandium, or an alloy material which includes any of these metal materials as its main component is preferably used. Note that the gate electrode 241, the gate electrode 242, and the conductive layer 108 may have a single-layer structure or a layered structure.

The insulating layer 243 can be formed using a light-transmitting insulating material such as a silicon oxide film, a silicon oxynitride film, a silicon nitride oxide film, or an organic resin film. The insulating layer 243 may have a single-layer structure or a layered structure.

The conductive layers 244, 245, 246, 247, 254, and 255 can be formed using any of the following materials: a metal such as molybdenum, titanium, chromium, tantalum, tungsten, aluminum, copper, or yttrium; an alloy material including any of these metals as its main component; a conductive metal oxide such as indium oxide; and the like. These conductive layers may have a single-layer structure or a layered structure.

The insulating layer 233 can be formed to have a single-layer structure or a layered structure using a light-transmitting insulating material such as a silicon oxide film, a silicon oxynitride film, a silicon nitride oxide film, or an organic resin film. It is preferable that the insulating layer 233 have a flat surface.

The conductive layer 252 (the pixel electrode) is a light-transmitting conductive layer and can be formed using a material such as indium tin oxide (ITO), indium tin oxide including silicon oxide (ITSO), or indium zinc oxide.

Note that this embodiment can be combined with any of the other embodiments in this specification as appropriate.

REFERENCE NUMERALS

11: signal line, 12: signal line, 13: signal line, 14: node, 15: signal line, 16: signal line, 17: signal line, 18: node, 100: optical sensor, 101: circuit, 102: photodiode, 103: transistor, 104: transistor, 105: transistor, 106: transistor, 108: conductive layer, 110: optical sensor group, 120: optical sensor group, 200: light-transmitting substrate, 203: p-type semiconductor region, 204: i-type semiconductor region, 205: n-type semiconductor region, 206: i-type semiconductor region, 207: n-type semiconductor region, 208: i-type semiconductor region, 209: n-type semiconductor region, 210: conductive film, 211: conductive film, 212: conductive film, 213: conductive film, 214: conductive film, 215: semiconductor film, 216: semiconductor film, 217: semiconductor film, 218: conductive film, 219: conductive film, 220: conductive film, 221: conductive film, 222: conductive film, 223: conductive film, 224: conductive film, 225: conductive film, 226: conductive film, 227: conductive film, 228: gate insulating film, 230: n-type semiconductor region, 231: light-blocking layer, 232: base film, 233: insulating layer, 240: insulating layer, 241: gate electrode, 242: gate electrode, 243: insulating layer, 244: conductive layer, 245: conductive layer, 246: conductive layer, 247: conductive layer, 248: p-type semiconductor region, 249: i-type semiconductor region, 250: active layer, 251: substrate, 252: conductive layer, 253: n-type semiconductor region, 254: conductive layer, 255: conductive layer, 281: insulating film, 282: insulating film, 301: pulse, 302: pulse, 402: photodiode, 403: transistor, 404: transistor, 405: transistor, 411: substrate, 412: n-well, 413: n-well, 414: n-well, 415: n-well, 416: field oxide film, 417: gate insulating film, 418: gate insulating film, 419: gate insulating film, 420: gate, 420*a*: polycrystalline silicon layer, 420*b*: silicide layer, 423: low-concentration drain region, 424: low-concentration drain region, 425: low-concentration drain region, 426: sidewall, 427: sidewall, 428: sidewall, 430: source region, 431: source region, 432: source region, 433: drain region, 434: drain region, 435: drain region, 436: interlayer insulating film, 437: interlayer insulating film, 440: source wiring, 441: source wiring, 442: source wiring, 443: drain wiring, 444: drain wiring, 445: drain wiring, 446: electrode, 447: passivation film, 448: interlayer insulating film, 449: electrode, 450: electrode, 451: electrode, 452: electrode, 453: electrode, 454: electrode, 455: interlayer insulating film, 456: pixel electrode, 457: transparent conductive film, 458: transparent conductive film, 459: organic EL layer, 460: photoelectric conversion layer, 460*i*: i-type semiconductor layer, 460*n*: n-type semiconductor layer, 460*p*: p-type semiconductor layer, 461: partition, 462: transparent conductive film, 463: transparent conductive film, 500: semiconductor device, 501: pixel, 502: light receiving portion, 503: signal processing circuit, 504: light source, 505: irradiation controller, 506: object, 507: infrared light, 508: reflected light, 517: visible light, and 518: visible light.

This application is based on Japanese Patent Application serial No. 2012-053041 filed with Japan Patent Office on Mar. 9, 2012, Japanese Patent Application serial No. 2012-054947 filed with Japan Patent Office on Mar. 12, 2012, and Japanese Patent Application serial No. 2012-056150 filed with Japan Patent Office on Mar. 13, 2012, the entire contents of which are hereby incorporated by reference.

The invention claimed is:

1. A method for driving a semiconductor device comprising a photosensor comprising a photodiode, comprising the steps of:

performing first reset operation by supplying a first signal to a first terminal of the photodiode from a first time to a second time;

performing first irradiation of an object with first light from a light source from the second time to a fourth time;

performing first imaging by detecting the first light reflected off the object from the second time to the fourth time;

repeating the first irradiation and the first imaging n (n is a natural number of 2 or more) times;

performing second irradiation of the object with second light from the light source from a twelfth time to a fifteenth time;

performing second reset operation by supplying the first signal to the first terminal of the photodiode from a fourteenth time to the fifteenth time;

performing second imaging by detecting the second light reflected off the object from the fifteenth time to a sixteenth time; and repeating the second irradiation and the second imaging the n times, wherein a time length from the second time to the fourth time and a time length from the twelfth time to the fifteenth time are the same.

2. The method for driving the semiconductor device according to claim 1, further comprising the steps of:

obtaining a first detection signal by the first imaging;

obtaining a second detection signal by the second imaging; and obtaining a distance from the light source to the object with the first detection signal and the second detection signal.

3. The method for driving the semiconductor device according to claim 2, further comprising the step of:

obtaining the distance x from the light source to the object by using the following equation:

$$x = \frac{c \times T \times S_2}{2 \times (S_1 + S_2)},$$

wherein:

$S_1$ represents the first detection signal;

$S_2$ represents the second detection signal;

T represents the time length from the second time to the fourth time; and c represents light speed.

4. The method for driving the semiconductor device according to claim 1, wherein the first light reflected off the object enters the photodiode from a third time to a fifth time, wherein the second light reflected off the object enters the photodiode from a thirteenth time to the sixteenth time, and wherein a time length from the second time to the third time, a time length from the fourth time to the fifth time, a time length from the twelfth time to the thirteenth time, and a time length from the fifteenth time to the sixteenth time are the same.

5. The method for driving the semiconductor device according to claim 4, wherein the photosensor comprises a first transistor and a second transistor, wherein a first terminal of the first transistor is electrically connected to a second terminal of the photodiode, wherein a second terminal of the first transistor is electrically connected to a gate of the second transistor, and wherein the method comprises the steps of:

performing the first imaging by supplying a second signal to a gate of the first transistor from the second time to the fourth time; and performing the second imaging by supplying the second signal to the gate of the first transistor from the fifteenth time to a seventeenth time.

6. The method for driving the semiconductor device according to claim 5, wherein the first transistor comprises an oxide semiconductor layer comprising a channel formation region.

7. A method for driving a semiconductor device comprising a first photosensor and a second photosensor adjacent to each other, the first photosensor comprising a first photodiode, the second photosensor comprising a second photodiode, comprising the steps of:

performing first reset operation for the first photosensor by supplying a first signal to a first terminal of the first photodiode from a first time to a second time;

performing first irradiation of an object with first light from a light source from the second time to a fifth time;

performing first imaging for the first photosensor by detecting the first light reflected off the object from the second time to the fifth time;

performing second reset operation for the second photosensor by supplying the first signal to a first terminal of the second photodiode from a fourth time to the fifth time;

performing second imaging for the second photosensor by detecting the first light reflected off the object from the fifth time to a sixth time; and repeating the first irradiation, the first imaging and the second imaging n (n is a natural number of 2 or more) times.

8. The method for driving the semiconductor device according to claim 7, further comprising the steps of:

obtaining a first detection signal by the first imaging;

obtaining a second detection signal by the second imaging; and obtaining a distance from the light source to the object with the first detection signal and the second detection signal.

9. The method for driving the semiconductor device according to claim 8, further comprising the step of:

obtaining the distance x from the light source to the object by using the following equation:

$$x = \frac{c \times T \times S_2}{2 \times (S_1 + S_2)},$$

wherein:

$S_1$ represents the first detection signal;

$S_2$ represents the second detection signal;

T represents a time length from the second time to the fifth time; and c represents light speed.

10. The method for driving the semiconductor device according to claim 7, wherein the first light reflected off the object enters the first photodiode and the second photodiode from a third time to the sixth time, wherein a time length from the second time to the third time and a time length from the fifth time to the sixth time are the same.

11. The method for driving the semiconductor device according to claim 10, wherein the first photosensor comprises a first transistor and a second transistor, wherein the second photosensor comprises a third transistor and a fourth transistor, wherein a first terminal of the first transistor is electrically connected to a second terminal of the first photodiode, wherein a second terminal of the first transistor is electrically connected to a gate of the second transistor, wherein a first terminal of the third transistor is electrically connected to a second terminal of the second photodiode, wherein a second terminal of the third transistor is electrically connected to a gate of the fourth transistor, and wherein the method comprises the steps of:

performing the first imaging for the first photosensor by supplying a second signal to a gate of the first transistor from the second time to the fifth time; and performing the second imaging for the second photosensor by supplying the second signal to a gate of the third transistor from the fifth time to a seventh time.

12. The method for driving the semiconductor device according to claim 11, wherein the first transistor comprises an oxide semiconductor layer comprising a channel formation region, and wherein the third transistor comprises an oxide semiconductor layer comprising a channel formation region.

13. A method for driving a semiconductor device comprising a first photosensor and a second photosensor, the first photosensor comprising a first photodiode, the second photosensor comprising a second photodiode, comprising the steps of:

performing first reset operation for the first photosensor by supplying a first signal to a first terminal of the first photodiode from a first time to a second time;

performing first irradiation of an object with first light from a light source from the second time to a fourth time;

performing first imaging for the first photosensor by detecting the first light reflected off the object from the second time to the fourth time;

repeating the first irradiation and the first imaging n (n is a natural number of 2 or more) times;

performing second irradiation of the object with second light from the light source from a twelfth time to a fifteenth time;

performing second reset operation for the first photosensor by supplying the first signal to the first terminal of the first photodiode from a fourteenth time to the fifteenth time;

performing second imaging for the first photosensor by detecting the second light reflected off the object from the fifteenth time to a seventeenth time;

repeating the second irradiation and the second imaging the n times; and performing a third imaging for the second photosensor by detecting third light from the second time to the fourth time and from the fifteenth time to the seventeenth time, wherein the second photodiode is formed over the first photodiode, and wherein a time length from the second time to the fourth time and a time length from the twelfth time to the fifteenth time are the same.

14. The method for driving the semiconductor device according to claim 13, further comprising the steps of:

obtaining a first detection signal by the first imaging;

obtaining a second detection signal by the second imaging; and obtaining a distance from the light source to the object with the first detection signal and the second detection signal.

15. The method for driving the semiconductor device according to claim 14, further comprising the step of:

obtaining the distance x from the light source to the object by the following equation:

$$x = \frac{c \times T \times S_2}{2 \times (S_1 + S_2)},$$

wherein:

$S_1$ represents the first detection signal;

$S_2$ represents the second detection signal;

T represents the time length from the second time to the fourth time; and c represents light speed.

16. The method for driving the semiconductor device according to claim 13, wherein the first light reflected off the object enters the first photodiode from a third time to a fifth time, wherein the second light reflected off the object enters the first photodiode from a thirteenth time to a sixteenth time, and wherein a time length from the second time to the third time, a time length from the fourth time to the fifth time, a time length from the twelfth time to the thirteenth time, and a time length from the fifteenth time to the sixteenth time are the same.

17. The method for driving the semiconductor device according to claim 16, wherein the first photosensor comprises a first transistor and a second transistor, wherein a first terminal of the first transistor is electrically connected to a second terminal of the first photodiode, wherein a second terminal of the first transistor is electrically connected to a gate of the second transistor, and wherein the method comprises the steps of:

performing the first imaging for the first photosensor by supplying a third signal to a gate of the first transistor from the second time to the fourth time; and performing the second imaging for the first photosensor by supplying the third signal to the gate of the first transistor from the fifteenth time to the seventeenth time.

18. The method for driving the semiconductor device according to claim 17, wherein the first transistor comprises an oxide semiconductor layer comprising a channel formation region.

19. The method for driving the semiconductor device according to claim 18, wherein the first light comprises first infrared light, wherein the second light comprises second infrared light, and wherein the method comprises the steps of:

performing the first imaging for the first photosensor by detecting the first infrared light reflected off the object and transmitted through the second photodiode; and performing the second imaging for the first photosensor by detecting the second infrared light reflected off the object and transmitted through the second photodiode.

20. The method for driving the semiconductor device according to claim 19, wherein the first photodiode comprises a single crystal silicon, and wherein the second photodiode comprises an amorphous silicon.

* * * * *